(12) United States Patent
Park et al.

(10) Patent No.: US 11,626,430 B2
(45) Date of Patent: Apr. 11, 2023

(54) IMAGE SENSING DEVICE FOR CORRECTING DEPTH INFORMATION

(71) Applicant: SK hynix Inc., Gyeonggi-do (KR)

(72) Inventors: Yujin Park, Gyeonggi-do (KR);
Sungwook Seo, Gyeonggi-do (KR);
Jeongeun Song, Gyeonggi-do (KR);
Minseok Shin, Gyeonggi-do (KR);
Ohjun Kwon, Gyeonggi-do (KR);
Hansang Kim, Gyeonggi-do (KR);
Kangbong Seo, Gyeonggi-do (KR);
Jinuk Jeon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 257 days.

(21) Appl. No.: 16/892,996

(22) Filed: Jun. 4, 2020

(65) Prior Publication Data

US 2021/0202548 A1 Jul. 1, 2021

(30) Foreign Application Priority Data

Dec. 27, 2019 (KR) .......................... 10-2019-0176828

(51) Int. Cl.
| | |
|---|---|
| *H01L 27/146* | (2006.01) |
| *H04N 5/232* | (2006.01) |
| *H04N 5/376* | (2011.01) |
| *H04N 5/369* | (2011.01) |
| *H04N 5/374* | (2011.01) |
| *H04N 5/341* | (2011.01) |

(52) U.S. Cl.
CPC ... *H01L 27/14609* (2013.01); *H04N 5/23241* (2013.01); *H04N 5/232125* (2018.08); *H01L 27/14689* (2013.01)

(58) Field of Classification Search
CPC ......... H01L 27/14609; H01L 27/14689; H01L 27/146; H04N 5/232125; H04N 5/23241; H04N 5/3765; H04N 5/369; H04N 5/374; H04N 5/36965; H04N 5/341; H04N 5/3696
USPC ................................................... 348/370, 371
See application file for complete search history.

(56) References Cited

U.S. PATENT DOCUMENTS

| | | | |
|---|---|---|---|
| 7,474,136 B2 | 1/2009 | Heightley | |
| 8,624,181 B1* | 1/2014 | Newton | H01J 49/06 250/281 |
| 9,628,092 B2 | 4/2017 | Francom et al. | |
| 9,847,736 B2 | 12/2017 | Grootjans et al. | |
| 2004/0217794 A1 | 11/2004 | Strysko | |
| 2016/0269014 A1* | 9/2016 | Lim | H04N 5/3765 |
| 2017/0313250 A1* | 11/2017 | Fischer | H04N 7/183 |
| 2018/0128919 A1 | 5/2018 | Ichikawa et al. | |
| 2019/0007592 A1* | 1/2019 | Otani | H04N 5/3728 |
| 2019/0238738 A1* | 8/2019 | Kunishige | H04N 5/23296 |
| 2020/0249348 A1* | 8/2020 | Mathy | G01S 17/894 |
| 2021/0181349 A1* | 6/2021 | Lee | G06T 7/521 |

* cited by examiner

*Primary Examiner* — Albert H Cutler
(74) *Attorney, Agent, or Firm* — IP & T Group LLP

(57) ABSTRACT

An image sensing device includes an image sensor suitable for correcting depth information based on a control signal, and for generating image data according to the depth information, and a controller suitable for analyzing an error of the depth information, and for generating the control signal, based on first and second cycle signals provided from the image sensor.

24 Claims, 37 Drawing Sheets

IMAGE SENSING DEVICE FOR CORRECTING DEPTH INFORMATION

CROSS-REFERENCE TO RELATED APPLICATION(S)

This application claims priority under 35 U.S.C. § 119 to Korean Patent Application No. KR 10-2019-0176828, filed on Dec. 27, 2019, the disclosure of which is incorporated herein by reference in its entirety.

BACKGROUND

1. Field

Various embodiments of the present disclosure relate to a semiconductor design technique, and more particularly, to an image sensing device.

2. Description of the Related Art

Image sensing devices are devices for capturing images using the photosensitive property of semiconductor. Image sensing devices may be roughly classified into charge-coupled device (CCD) image sensing devices and complementary metal-oxide semiconductor (CMOS) image sensing devices. Recently, CMOS image sensing devices are widely used because the CMOS image sensing devices can allow both analog and digital control circuits to be directly implemented on a single integrated circuit (IC).

SUMMARY

Various embodiments of the present disclosure are directed to an image sensing device capable of correcting depth information.

In accordance with an embodiment, an image sensing device includes: an image sensor suitable for correcting depth information based on a control signal, and generating image data according to the depth information; and a controller suitable for analyzing an error of the depth information, and generating the control signal, based on first and second cycle signals provided from the image sensor.

The first cycle signal may be used to generate a light signal emitted to a subject, and the second cycle signal may be used to measure the depth information.

The image sensor may include: a light driver suitable for emitting a light signal to a subject based on the first cycle signal; a pixel driver suitable for generating a pixel driving signal based on the second cycle signal; a pixel array including at least one pixel for sensing the light signal reflected from the subject, based on the pixel driving signal; and a corrector suitable for generating the first and the second cycle signals each having a duty cycle based on the control signal and a clock signal.

In accordance with another embodiment, an image sensing device includes: an image sensor suitable for correcting depth information based on a control signal, and generating image data according to the depth information; and a controller suitable for analyzing an error of the depth information and generating the control signal, based on the image data.

The image sensor may include: a light driver suitable for emitting a light signal to a subject based on a first cycle signal; a pixel driver suitable for generating a pixel driving signal based on a second cycle signal; a pixel array including at least one pixel for sensing the light signal reflected from the subject based on the pixel driving signal; and a corrector suitable for generating the first and second cycle signals each having a duty cycle based on the control signal and a clock signal.

The corrector may include: a first load suitable for generating a correction target signal corresponding to the clock signal; a duty cycle correction circuit suitable for correcting a duty cycle of the correction target signal according to a duty cycle of the second cycle signal, and for generating the first cycle signal, based on the control signal; and a second load suitable for generating the second cycle signal corresponding to the clock signal.

The duty cycle correction circuit may include: a delay circuit suitable for sequentially delaying the correction target signal by a unit delay time, and for generating a plurality of delayed clock signals; a logic circuit suitable for performing a logic operation on the plurality of delayed clock signals, and for generating a plurality of operation clock signals; and a selection circuit suitable for outputting any one of the plurality of operation clock signals as the first cycle signal based on the control signal.

The delay circuit may include a plurality of delay element groups coupled in series to one another, and may output the plurality of delayed clock signals based on the correction target signal, and wherein each of the delay element groups may include an even number of inverters coupled in series to one another.

The logic circuit may include: a first logic element group suitable for generating at least one operation clock signal having a negative duty cycle, compared to the clock signal, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, based on the delayed clock signal having the medium delay amount and delayed clock signals having delay amounts greater than the medium delay amount among the plurality of delayed clock signals.

The selection circuit may include: decoder suitable for decoding the control signal, and for generating a selection code signal; and multiplexer suitable for outputting any one of the operation clock signals as the first cycle signal based on the selection code signal.

The corrector may include: a first load suitable for generating the first cycle signal corresponding to the clock signal; a second load suitable for generating a correction target signal corresponding to the clock signal; and a duty cycle correction circuit suitable for correcting a duty cycle of the correction target signal according to a duty cycle of the first cycle signal, and for generating the second cycle signal, based on the control signal.

The duty cycle correction circuit may include: a delay circuit suitable for sequentially delaying the correction target signal by a unit delay time, and for generating a plurality of delayed clock signals; a logic circuit suitable for performing a logic operation on the plurality of delayed clock signals, and for generating a plurality of operation clock signals; and a selection circuit suitable for outputting any one of the plurality of operation clock signals as the second cycle signal based on the control signal.

The delay circuit may include a plurality of delay element groups coupled in series to one another, and may output the plurality of delayed clock signals based on the correction target signal, and wherein each of the delay element groups may include an even number of inverters coupled in series to one another.

The logic circuit may include: a first logic element group suitable for generating at least one operation clock signal having a negative duty cycle, compared to the clock signal, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, based on the delayed clock signal having the medium delay amount and delayed clock signals having delay amounts greater than the medium delay amount among the plurality of delayed clock signals.

The selection circuit may include: a decoder suitable for decoding the control signal, and for generating a selection code signal; and a multiplexer suitable for outputting any one of the operation clock signals as the second cycle signal based on the selection code signal.

The corrector may include: a first load suitable for generating a first correction target signal corresponding to the clock signal; a first duty cycle correction circuit suitable for correcting a duty cycle of the first correction target signal according to a duty cycle of the second cycle signal, and for generating the first cycle signal, based on the control signal and a first enable signal; a second load suitable for generating a second correction target signal corresponding to the clock signal; and a second duty cycle correction circuit suitable for correcting a duty cycle of the second correction target signal according to a duty cycle of the first cycle signal, and for generating the second cycle signal, based on the control signal and a second enable signal.

The first duty cycle correction circuit may include: a delay circuit suitable for sequentially delaying the first correction target signal by a unit delay time, and for generating a plurality of delayed clock signals; a logic circuit suitable for performing a logic operation on the plurality of delayed clock signals, and for generating a plurality of operation clock signals; and a selection circuit suitable for outputting any one of the plurality of operation clock signals as the first cycle signal based on the control signal and the first enable signal.

The delay circuit may include a plurality of delay element groups coupled in series to one another, and may output the plurality of delayed clock signals based on the first correction target signal, and wherein each of the delay element groups may include an even number of inverters coupled in series to one another.

The logic circuit may include: a first logic element group suitable for generating at least one operation clock signal having a negative duty cycle, compared to the clock signal, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, based on the delayed clock signal having the medium delay amount and delayed clock signals having delay amounts greater than the medium delay amount among the plurality of delayed clock signals.

The selection circuit may include: a buffer suitable for generating a signal corresponding to the control signal or maintaining the signal which is set regardless of the control signal, based on the first enable signal; a decoder suitable for decoding the signal, and for generating a selection code signal; and a multiplexer suitable for outputting any one of the operation clock signals as the first cycle signal based on the selection code signal.

The second duty cycle correction circuit may include: a delay circuit suitable for sequentially delaying the second correction target signal by a unit delay time, and for generating a plurality of delayed clock signals; a logic circuit suitable for performing a logic operation on the plurality of delayed clock signals, and for generating a plurality of operation clock signals; and a selection circuit suitable for outputting any one of the plurality of operation clock signals as the second cycle signal based on the control signal and the second enable signal.

The delay circuit may include a plurality of delay element groups coupled in series to one another, and may output the plurality of delayed clock signals based on the second correction target signal, and wherein each of the delay element groups may include an even number of inverters coupled in series to one another.

The logic circuit may include: a first logic element group suitable for generating at least one operation clock signal having a negative duty cycle, compared to the clock signal, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal based on the delayed clock signal having the medium delay amount and delayed clock signals having delay amounts greater than the medium delay amount among the plurality of delayed clock signals.

The selection circuit may include: a buffer suitable for generating a signal corresponding to the control signal or maintaining the signal which is set regardless of the control signal, based on the second enable signal; a decoder suitable for decoding the signal, and for generating a selection code signal; and a multiplexer suitable for outputting any one of the operation clock signals as the second cycle signal based on the selection code signal.

The controller may perform an error analysis operation on the depth information for a predetermined number of times, and statically generates the control signal, in a test mode.

The image data may be a digital signal, and the controller may generate the control signal, directly using the image data.

The controller may include: a comparison circuit suitable for comparing the image data with reference data, and for generating a comparison signal; and a determination circuit suitable for determining the error of the depth information, and for generating the control signal, based on the comparison signal.

In accordance with still another embodiment, an image sensing device includes: an image sensor suitable for correcting depth information based on first and second control signals, and for generating image data according to the corrected depth information; a first controller suitable for analyzing an error of the depth information and for generating the first control signal, based on the image data, in a test mode; and a second controller suitable for analyzing the error of the depth information and for generating the second control signal, based on first and second cycle signals provided from the image sensor, in a normal mode.

The first cycle signal may be used to generate a light signal emitted to a subject, and the second cycle signal may be used to measure the depth information.

The image sensor may include: a light driver suitable for emitting a light signal to a subject based on the first cycle signal; a pixel driver suitable for generating a pixel driving signal based on the second cycle signal; a pixel array including at least one pixel for sensing the light signal reflected from the subject, based on the pixel driving signal; and a corrector suitable for generating the first and the second cycle signals each having a duty cycle based on the first and second control signals, a clock signal and a test mode signal.

The corrector may include: a first load suitable for generating a correction target signal corresponding to the clock signal; a duty cycle correction circuit suitable for correcting a duty cycle of the correction target signal according to a duty cycle of the second cycle signal, and for generating the first cycle signal, based on the first and second control signals and the test mode signal; and a second load suitable for generating the second cycle signal corresponding to the clock signal.

The duty cycle correction circuit may include: a delay circuit suitable for sequentially delaying the correction target signal by a unit delay time, and for generating a plurality of delayed clock signals; a logic circuit suitable for performing a logic operation on the plurality of delayed clock signals, and for generating a plurality of operation clock signals; and a selection circuit suitable for outputting any one of the plurality of operation clock signals as the first cycle signal based on the first and second control signals and the test mode signal.

The delay circuit may include a plurality of delay element groups coupled in series to one another, and may output the plurality of delayed clock signals based on the correction target signal, and wherein each of the delay element groups includes an even number of inverters coupled in series to one another.

The logic circuit may include: a first logic element group suitable for generating at least one operation clock signal having a negative duty cycle, compared to the clock signal, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, based on the delayed clock signal having the medium delay amount and delayed clock signals having delay amounts greater than the medium delay amount among the plurality of delayed clock signals.

The selection circuit may include: a first multiplexer suitable for outputting any one of the first and second control signals as a control signal based on the test mode signal; a decoder suitable for decoding the control signal, and for generating a selection code signal; and a second multiplexer suitable for outputting any one of the operation clock signals as the first cycle signal based on the selection code signal.

The corrector may include: a first load suitable for generating the first cycle signal corresponding to the clock signal; a second load suitable for generating a correction target signal corresponding to the clock signal; and a duty cycle correction circuit suitable for correcting a duty cycle of the correction target signal according to a duty cycle of the first cycle signal, and for generating the second cycle signal, based on the first and second control signals and the test mode signal.

The duty cycle correction circuit may include: a delay circuit suitable for sequentially delaying the correction target signal by a unit delay time, and for generating a plurality of delayed clock signals; a logic circuit suitable for performing a logic operation on the plurality of delayed clock signals, and for generating a plurality of operation clock signals; and a selection circuit suitable for outputting any one of the plurality of operation clock signals as the second cycle signal based on the first and second control signals and the test mode signal.

The delay circuit may include a plurality of delay element groups coupled in series to one another, and may output the plurality of delayed clock signals based on the correction target signal, and wherein each of the delay element groups may include an even number of inverters coupled in series to one another.

The logic circuit may include: a first logic element group suitable for generating at least one operation clock signal having a negative duty cycle, compared to the clock signal, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, based on the delayed clock signal having the medium delay amount and delayed clock signals having delay amounts greater than the medium delay amount among the plurality of delayed clock signals.

The selection circuit may include: a first multiplexer suitable for outputting any one of the first and second control signals as a control signal based on the test mode signal; a decoder suitable for decoding the control signal, and for generating a selection code signal; and a second multiplexer suitable for outputting any one of the operation clock signals as the second cycle signal based on the selection code signal.

The corrector may include: a first load suitable for generating a first correction target signal corresponding to the clock signal; a first duty cycle correction circuit suitable for correcting a duty cycle of the first correction target signal according to a duty cycle of the second cycle signal, and for generating the first cycle signal, based on the first and second control signals, the test mode signal and a first enable signal; a second load suitable for generating a second correction target signal corresponding to the clock signal; and a second duty cycle correction circuit suitable for correcting a duty cycle of the second correction target signal according to a duty cycle of the first cycle signal, and for generating the second cycle signal, based on the first and second control signals, the test mode signal and a second enable signal.

The first duty cycle correction circuit may include: a delay circuit suitable for sequentially delaying the first correction target signal by a unit delay time, and for generating a plurality of delayed clock signals; a logic circuit suitable for performing a logic operation on the plurality of delayed clock signals, and for generating a plurality of operation clock signals; and a selection circuit suitable for outputting any one of the plurality of operation clock signals as the first cycle signal based on the first and second control signals, the test mode signal and the first enable signal.

The delay circuit may include a plurality of delay element groups coupled in series to one another, and may output the plurality of delayed clock signals based on the first correction target signal, and wherein each of the delay element groups may include an even number of inverters coupled in series to one another.

The logic circuit may include: a first logic element group suitable for generating at least one operation clock signal having a negative duty cycle, compared to the clock signal, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, based on the delayed clock signal having the medium delay amount and delayed clock signals having delay amounts greater than the medium delay amount among the plurality of delayed clock signals.

The selection circuit may include: a first multiplexer suitable for outputting any one of the first and second control signals as a control signal based on the test mode signal; a buffer suitable for generating a signal corresponding to the control signal or maintaining the signal which is set regardless of the control signal, based on the first enable signal; a decoder suitable for decoding the signal, and for generating a selection code signal; and a second multiplexer suitable for outputting any one of the operation clock signals as the first cycle signal based on the selection code signal.

The second duty cycle correction circuit may include: a delay circuit suitable for sequentially delaying the second correction target signal by a unit delay time, and for generating a plurality of delayed clock signals; a logic circuit suitable for performing a logic operation on the plurality of delayed clock signals, and for generating a plurality of operation clock signals; and a selection circuit suitable for outputting any one of the plurality of operation clock signals as the second cycle signal based on the first and second control signals, the test mode signal and the second enable signal.

The delay circuit may include a plurality of delay element groups coupled in series to one another, and may output the plurality of delayed clock signals based on the second correction target signal, and wherein each of the delay element groups may include an even number of inverters coupled in series to one another.

The logic circuit may include: a first logic element group suitable for generating at least one operation clock signal having a negative duty cycle, compared to the clock signal, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, based on the delayed clock signal having the medium delay amount and delayed clock signals having delay amounts greater than the medium delay amount among the plurality of delayed clock signals.

The selection circuit may include: a first multiplexer suitable for outputting any one of the first and second control signals as a control signal based on the test mode signal; a buffer suitable for generating a signal corresponding to the control signal or maintaining the signal which is set regardless of the control signal, based on the second enable signal; a decoder suitable for decoding the signal, and for generating a selection code signal; and a second multiplexer suitable for outputting any one of the operation clock signals as the second cycle signal based on the selection code signal.

The first controller may perform an error analysis operation on the depth information for a predetermined number of times, and may statically generate the first control signal, in the test mode, and the second controller may perform the error analysis operation on the depth information in real time, and may dynamically generate the second control signal, in the normal mode.

The first controller may include: a comparison circuit suitable for comparing the image data with reference data, and for generating a comparison signal; and a determination circuit suitable for determining the error of the depth information, and for generating the first control signal, based on the comparison signal.

The image data may be a digital signal, and the first controller may generate the control signal, directly using the image data.

The second controller may include: a detection circuit suitable for detecting a duty cycle difference between the first cycle signal and the second cycle signal, and for generating a detection signal; and a conversion circuit suitable for converting the detection signal into a digital signal, and outputting the control signal.

In accordance with still another embodiment, A method for correcting a depth information included in image data of a subject acquired by an image sensing device, wherein the depth information includes a distance between the image sensing device and the subject, the method includes: generating a first cycle signal used to generate a light signal emitted from the image sensing device to the subject; generating a second cycle signal used to measure the depth information; comparing a first duty cycle of the first cycle signal and a second duty cycle of the second cycle signal to detect a duty cycle difference between the first duty cycle and the second duty cycle; and adjusting the duty cycle difference between the first duty cycle and the second duty cycle to correct the depth information.

In accordance with still another embodiment, A method for correcting a depth information included in image data of a subject acquired by an image sensing device, wherein the depth information includes a distance between the image sensing device and the subject, the method includes: generating a first cycle signal used to generate a light signal emitted from the image sensing device to the subject; generating a second cycle signal used to measure the depth information; analyzing the depth information acquired by the image sensing device to detect an error of the depth information; and adjusting a difference between a first duty cycle of the first cycle signal and a second duty cycle of the second cycle signal to correct the error of the depth information.

These and other features and advantages of the present disclosure will become apparent to those skilled in the art of the invention from the following detailed description in conjunction with the following drawings.

DETAILED DESCRIPTION

Various embodiments are described below in more detail with reference to the accompanying drawings. These embodiments are provided so that this disclosure is thorough and complete, and fully conveys the scope of the present disclosure to those skilled in the art.

It will be understood that when an element is referred to as being "connected to", or "coupled to" another element, it may be directly on, connected to, or coupled to the other element, or one or more intervening elements may be present. In addition, it will also be understood that the terms "comprises," "comprising," "includes," and "including" when used in this specification, specify the presence of the stated elements and do not preclude the presence or addition of one or more other elements. As used herein, singular forms may include the plural forms as well and vice versa, unless the context clearly indicates otherwise. The articles "a" and "an" as used in this application and the appended claims should generally be construed to mean "one or more" unless specified otherwise or it is clear from context to be directed to a singular form.

Figure 1:
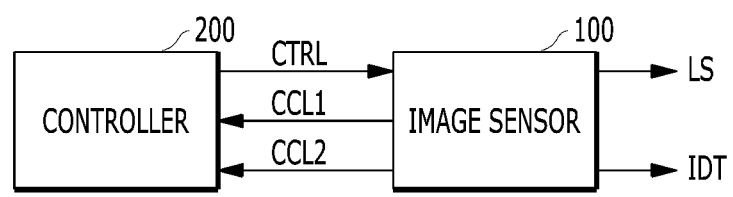
FIG. 1 is a block diagram illustrating an image sensing device in accordance with various embodiments of the present invention.

FIG. 1 is a block diagram illustrating an image sensing device in accordance with various embodiments of the present invention.

Referring to FIG. 1, the image sensing device may include an image sensor 100 and a controller 200.

The image sensor 100 may correct depth information based on a control signal CTRL, and generate image data IDT according to the corrected depth information. The depth information may include information on a distance between the image sensor 100 and a subject (not illustrated).

The image sensor 100 may provide the controller 200 with first and second cycle signals CCL1 and CCL2 required for generating the image data IDT. The first cycle signal CCL1 may be used to generate a light signal LS emitted to the subject (not illustrated). The second cycle signal CCL2 may be used to measure the depth information.

The controller 200 may analyze an error of the depth information, and generate the control signal CTRL, based on the first and second cycle signals CCL1 and CCL2 provided from the image sensor 100. In a normal mode, the controller 200 may perform an error analysis operation on the depth information in real time, and dynamically generate the control signal CTRL.

The controller 200 and the image sensor 100 may be integrated into the same chip (i.e., on-chip) or different chips (i.e., off-chip).

Figure 2:
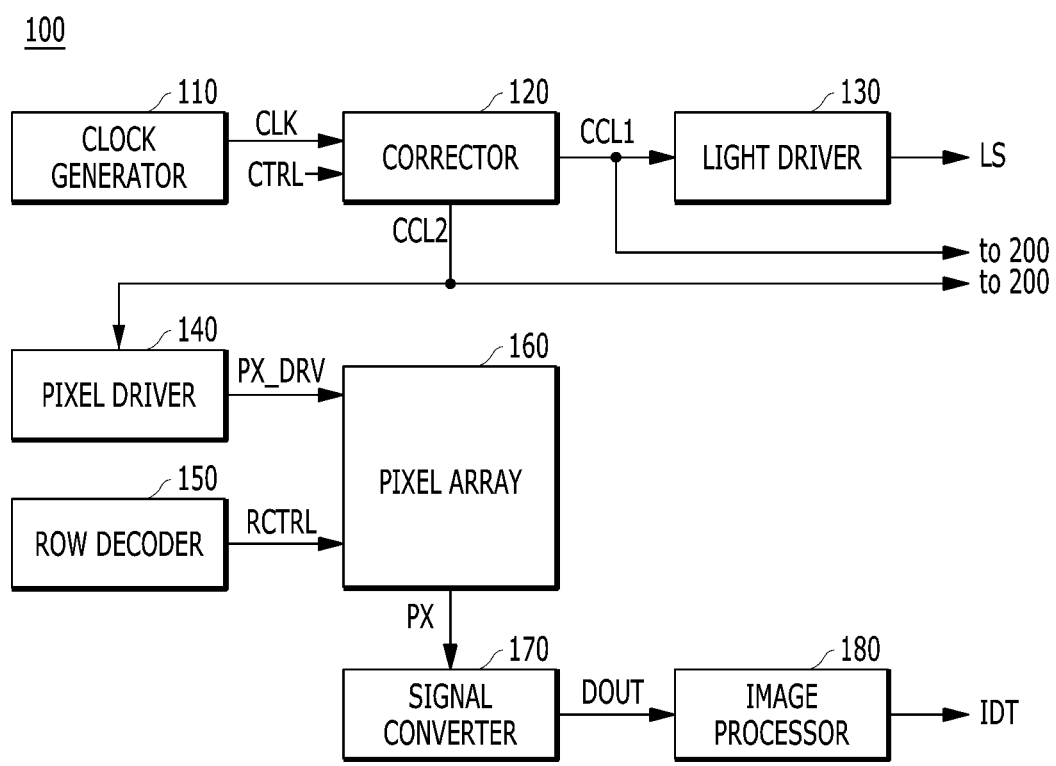
FIG. 2 is a block diagram illustrating an image sensor illustrated in FIG. 1 in accordance with various embodiments of the present invention.

FIG. 2 is a block diagram illustrating the image sensor 100 illustrated in FIG. 1.

Referring to FIG. 2, the image sensor 100 may include a clock generator 110, a corrector 120, a light driver 130, a pixel driver 140, a row decoder 150, a pixel array 160, a signal converter 170 and an image processor 180.

The clock generator 110 may generate a clock signal CLK in the normal mode. For example, the clock generator 110 may include a phase locked loop or an oscillator.

The corrector 120 may generate the first and second cycle signals CCL1 and CCL2 each having a duty cycle, based on the control signal CTRL and the clock signal CLK. The first and second cycle signals CCL1 and CCL2 may be designed to have the same duty cycle. Alternatively, the first and second cycle signals CCL1 and CCL2 may be designed to have different duty cycles. In the present embodiment, it is described as an example that the first and second cycle signals CCL1 and CCL2 are designed to have the same duty cycle.

The light driver 130 may emit the light signal LS to the subject based on the first cycle signal CCL1. For example, the light driver 130 may include a light emitting diode or a laser diode.

The pixel driver 140 may generate a pixel driving signal PX_DRV based on the second cycle signal CCL2. The pixel driving signal PX_DRV may be one of the signals employed for measuring the depth information.

The row decoder 150 may generate a row control signal RCTRL for controlling the pixel array 160 on a row-by-row basis.

The pixel array 160 may include a plurality of pixels disposed at intersections of a plurality of rows and a plurality of columns. The plurality of pixels may include at least one depth measuring pixel for measuring the depth information. The depth measuring pixel may sense a light signal (not illustrated) reflected from the subject, based on the pixel driving signal PX_DRV. The reflected light signal may be a signal obtained by reflecting the light signal LS from the subject. That is, the depth measuring pixel may generate a pixel signal PX corresponding to the depth information, based on the pixel driving signal PX_DRV and the reflected light signal.

The signal converter 170 may convert the pixel signal PX into a digital signal DOUT. For example, the signal converter 170 may include a correlated double sampling circuit and an analog-to-digital converter.

The image processor 180 may generate the image data IDT based on the digital signal DOUT. The image data IDT may include the depth information.

Figure 3:
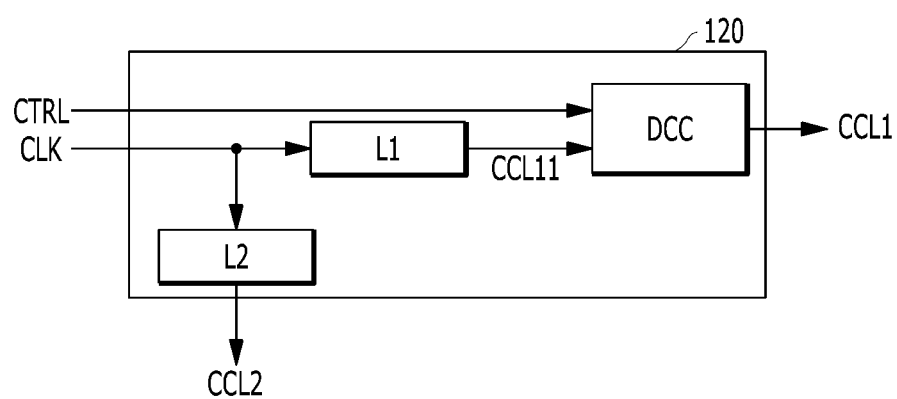
FIG. 3 is a block diagram illustrating an example of a corrector illustrated in FIG. 2 in accordance with various embodiments of the present invention.

FIG. 3 is a block diagram illustrating an example of the corrector 120 illustrated in FIG. 2.

Referring to FIG. 3, the corrector 120 may include a first load L1, a duty cycle correction circuit DCC and a second load L2.

The first load L1 may generate a correction target signal CCL11 corresponding to the clock signal CLK. The first load L1 may include a first line load occurring in a first path in which the correction target signal CCL11 is generated. The first line load may include all loads formed directly or indirectly in the first path. In addition, the first load L1 may be designed to further include a first circuit for tuning the clock signal CLK. A duty cycle of the correction target signal CCL11 may be changed differently from a duty cycle of the clock signal CLK when passing through the first load L1. That is, the duty cycle of the correction target signal CCL11 may be unintentionally adjusted.

The duty cycle correction circuit DCC may generate the first cycle signal CCL1 based on the control signal CTRL and the correction target signal CCL11. For example, the duty cycle correction circuit DCC may generate the first cycle signal CCL1 by correcting the duty cycle of the correction target signal CCL11 to correspond with a duty cycle of the second cycle signal CCL2.

The second load L2 may generate the second cycle signal CCL2 corresponding to the clock signal CLK. The second load L2 may include a second line load occurring in a second path in which the second cycle signal CCL2 is generated. The second line load may include all loads formed directly or indirectly in the second path. In addition, the second load L2 may be designed to further include a second circuit for tuning the clock signal CLK. The duty cycle of the second cycle signal CCL2 may be changed differently from the duty cycle of the clock signal CLK when passing through the second load L2. In other words, the duty cycle of the second cycle signal CCL2 may be unintentionally adjusted. In this case, the duty cycle of the second cycle signal CCL2 may be different from the duty cycle of the correction target signal CCL11.

Figure 4:
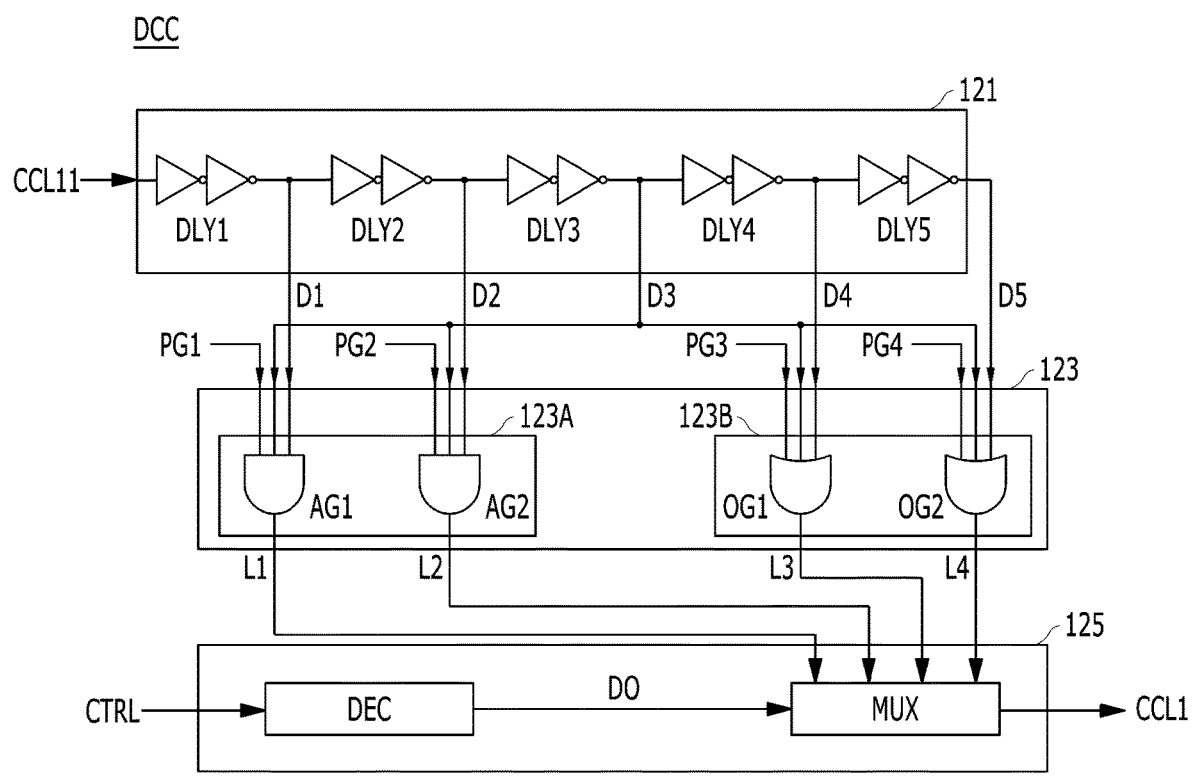
FIG. 4 is a block diagram illustrating a duty cycle correction circuit illustrated in FIG. 3 in accordance with various embodiments of the present invention.

FIG. 4 is a block diagram illustrating the duty cycle correction circuit DCC illustrated in FIG. 3. It is noted that the number of elements, element groups and signals included in the duty cycle correction circuit DCC of FIG. 4 are described as an example for convenience in description, and that the present disclosure is not limited thereto.

Referring to FIG. 4, the duty cycle correction circuit DCC may include a delay circuit 121, a logic circuit 123 and a selection circuit 125.

The delay circuit 121 may sequentially delay the correction target signal CCL11 by a unit delay time, and generate first to fifth delayed clock signals D1 to D5. The delay circuit 121 may include first to fifth delay element groups DLY1 to DLY5 coupled in series to one another. Each of the first to fifth delay element groups DLY1 to DLY5 may delay the correction target signal CCL11 and any one of the former delayed clock signals D1 to D4 by the unit delay time, and output each of the delayed clock signals D1 to D5. For example, the first delay element group DLY1 may delay the correction target signal CCL11 by the unit delay time to generate the delay clock signal D1. The second delay element group DLY2 may delay the delay clock signal D1 by the unit delay time to generate the delay clock signal D2. The third delay element group DLY3 may delay the delay clock signal D2 by the unit delay time to generate the delay clock signal D3. The fourth delay element group DLY4 may delay the delay clock signal D3 by the unit delay time to generate the delay clock signal D4. The fifth delay element group DLY5 may delay the delay clock signal D4 by the unit delay time to generate the delay clock signal D5. Each of the first to fifth delay element groups DLY1 to DLY5 may include an even number of inverters coupled in series to one another. Although it is described as an example in the present embodiment that each of the delay element groups includes the inverters, the present disclosure is not limited thereto. In various embodiments, each of the delay element groups may be designed to include a resistor and a capacitor.

The logic circuit 123 may perform a logic operation on each of the first to fifth delayed clock signals D1 to D5, and generate first to fourth operation clock signals L1 to L4. The logic circuit 123 may include a first logic element group 123A and a second logic element group 123B.

The first logic element group 123A may generate the first and second operation clock signals L1 and L2 having negative duty cycles, as compared with the clock signal CLK, among the first to fourth operation clock signals L1 to L4, based on the third delayed clock signal D3 having a medium delay amount and the first and second delayed clock signals D1 and D2 having delay amounts smaller than the medium delay amount among the first to fifth delayed clock signals D1 to D5. For example, the first logic element group 123A may include first and second AND gates AG1 and AG2. The first AND gate AG1 may perform a logic AND operation on the third delayed clock signal D3 having the medium delay amount and the first delayed clock signal D1, and generate the first operation clock signal L1. The second AND gate AG2 may perform the logic AND operation on the third delayed clock signal D3 having the medium delay amount and the second delayed clock signal D2, and generate the second operation clock signal L2. In addition, the first and second AND gates AG1 and AG2 may be enabled or disabled based on first and second power gating signals PG1 and PG2, respectively. Accordingly, power consumed unnecessarily by the first and second AND gates AG1 and AG2 can be saved.

The second logic element group 123B may generate the third and fourth operation clock signals L3 and L4 having positive duty cycles, as compared with the clock signal CLK, based on the third delayed clock signal D3 having the medium delay amount and the fourth and fifth delayed clock signals D4 and D5 having the delay amounts larger than the medium delay amount. For example, the second logic element group 123B may include first and second OR gates OG1 and OG2. The first OR gate OG1 may perform a logic OR operation on the third delayed clock signal D3 having the medium delay amount and the fourth delayed clock signal D4, and generate the third operation clock signal L3. The second OR gate OG2 may perform the logic OR operation on the third delayed clock signal D3 having the medium delay amount and the fifth delayed clock signal D5, and generate the fourth operation clock signal L4. In addition, the first and second OR gates OG1 and OG2 may be enabled or disabled based on third and fourth power gating signals PG3 and PG4, respectively. Accordingly, power consumed unnecessarily by the first and second OR gates OG1 and OG2 can be saved.

The selection circuit 125 may include a decoder DEC and a multiplexer MUX.

The decoder DEC may decode the control signal CTRL, and generate a selection code signal DO. For example, when the duty cycle of the correction target signal CCL11 has to be decreased, the decoder DEC may generate the selection code signal DO for allowing one of the first and second operation clock signals L1 and L2 to be selected as the first cycle signal CCL1. On the other hand, when the duty cycle of the correction target signal CCL11 has to be increased, the decoder DEC may generate the selection code signal DO for allowing one of the third and fourth operation clock signals L3 and L4 to be selected as the first cycle signal CCL1. In addition, the decoder DEC may generate the first to fourth power gating signals PG1 to PG4. For example, when the first operation clock signal L1 is selected the decoder DEC may deactivate the first power gating signal PG1, and activate the second to fourth power gating signals PG2 to PG4.

The multiplexer MUX may output any one of the first to fourth operation clock signals L1 to L4 as the first cycle signal CCL1 based on the selection code signal DO.

Figure 5:
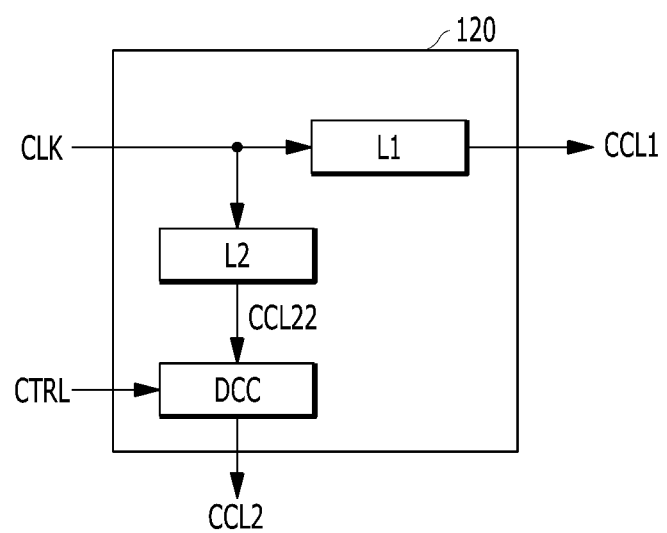
FIG. 5 is a block diagram illustrating another example of the corrector illustrated in FIG. 2 in accordance with various embodiments of the present invention.

FIG. 5 is a block diagram illustrating another example of the corrector 120 illustrated in FIG. 2.

Referring to FIG. 5, the corrector 120 may include a first load L1, a second load L2 and a duty cycle correction circuit DCC.

The first load L1 may generate the first cycle signal CCL1 corresponding to the clock signal CLK. The first load L1 may include a first line load occurring in a first path in which the first cycle signal CCL1 is generated. The first line load may include all loads formed directly or indirectly in the first path. In addition, the first load L1 may be designed to further include a first circuit for tuning the clock signal CLK. A duty cycle of the first cycle signal CCL1 may be changed differently from a duty cycle of the clock signal CLK when passing through the first load L1. In other words, the duty cycle of the first cycle signal CCL1 may be unintentionally adjusted.

The second load L2 may generate a correction target signal CCL22 corresponding to the clock signal CLK. The second load L2 may include a second line load occurring in a second path in which the correction target signal CCL22 is generated. The second line load may include all loads formed directly or indirectly in the second path. In addition, the second load L2 may be designed to further include a second circuit for tuning the clock signal CLK. A duty cycle of the correction target signal CCL22 may be changed differently from the duty cycle of the clock signal CLK when passing through the second load L2. In other words, the duty cycle of the correction target signal CCL22 may be unintentionally adjusted. In this case, the duty cycle of the correction target signal CCL22 may be different from the duty cycle of the first cycle signal CCL1.

The duty cycle correction circuit DCC may generate the second cycle signal CCL2 based on the control signal CTRL and the correction target signal CCL22. For example, the duty cycle correction circuit DCC may generate the second cycle signal CCL2 by correcting the duty cycle of the correction target signal CCL22 to correspond with the duty cycle of the first cycle signal CCL1.

Figure 6:
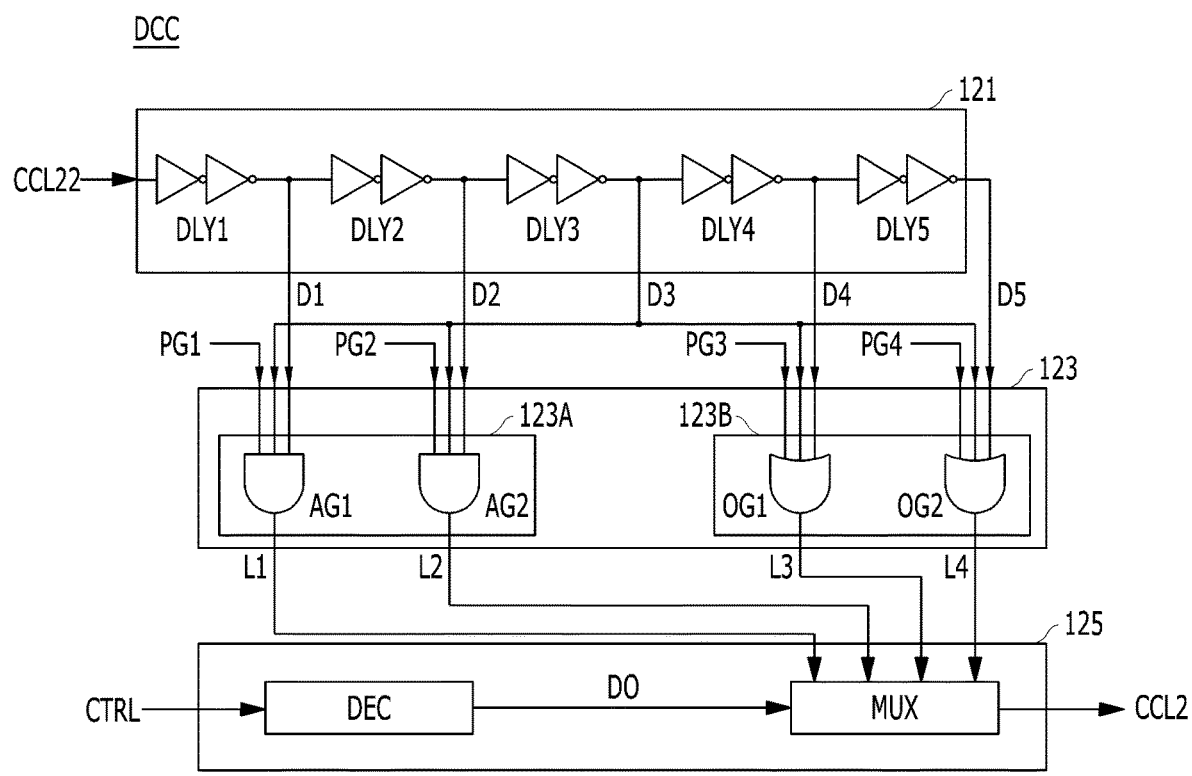
FIG. 6 is a block diagram illustrating a duty cycle correction circuit illustrated in FIG. 5 in accordance with various embodiments of the present invention.

FIG. 6 is a block diagram illustrating the duty cycle correction circuit DCC illustrated in FIG. 5. It is noted that the number of elements, element groups and signals included in the duty cycle correction circuit DCC of FIG. 6 are described as an example for convenience in description, and that the present disclosure is not limited thereto.

Referring to FIG. 6, the duty cycle correction circuit DCC may include a delay circuit 121, a logic circuit 123 and a selection circuit 125.

The delay circuit 121 may sequentially delay the correction target signal CCL22 by a unit delay time, and generate first to fifth delayed clock signals D1 to D5. The delay circuit 121 may include first to fifth delay element groups DLY1 to DLY5 coupled in series to one another. Each of the first to fifth delay element groups DLY1 to DLY5 may delay the correction target signal CCL22 and any one of the former delayed clock signals D1 to D4 by the unit delay time, and output each of the delayed clock signals D1 to D5. For example, the first delay element group DLY1 may delay the correction target signal CCL22 by the unit delay time to generate the delay clock signal D1. The second delay element group DLY2 may delay the delay clock signal D1 by the unit delay time to generate the delay clock signal D2. The third delay element group DLY3 may delay the delay clock signal D2 by the unit delay time to generate the delay clock signal D3. The fourth delay element group DLY4 may delay the delay clock signal D3 by the unit delay time to generate the delay clock signal D4. The fifth delay element group DLY5 may delay the delay clock signal D4 by the unit delay time to generate the delay clock signal D5. Each of the first to fifth delay element groups DLY1 to DLY5 may include an even number of inverters coupled in series to one another. Although it is described as an example in the present embodiment that each of the delay element groups includes the inverters, the present disclosure is not limited thereto. In various embodiments, each of the delay element groups may be designed to include a resistor and a capacitor.

The logic circuit 123 may perform a logic operation on each of the first to fifth delayed clock signals D1 to D5, and generate first to fourth operation clock signals L1 to L4. The logic circuit 123 may include a first logic element group 123A and a second logic element group 123B.

The first logic element group 123A may generate the first and second operation clock signals L1 and L2 having negative duty cycles, as compared with the clock signal CLK, based on the third delayed clock signal D3 having a medium delay amount and the first and second delayed clock signals D1 and D2 having delay amounts smaller than the medium delay amount among the first to fifth delayed clock signals D1 to D5. For example, the first logic element group 123A may include first and second AND gates AG1 and AG2. The first AND gate AG1 may perform a logic AND operation on the third delayed clock signal D3 having the medium delay amount and the first delayed clock signal D1, and generate the first operation clock signal L1. The second AND gate AG2 may perform the logic AND operation on the third delayed clock signal D3 having the medium delay amount and the second delayed clock signal D2, and generate the second operation clock signal L2. In addition, the first and second AND gates AG1 and AG2 may be enabled or disabled based on first and second power gating signals PG1 and PG2, respectively. Accordingly, power consumed unnecessarily by the first and second AND gates AG1 and AG2 can be saved.

The second logic element group 123B may generate the third and fourth operation clock signals L3 and L4 having positive duty cycles, as compared with the clock signal CLK, based on the third delayed clock signal D3 having the medium delay amount and the fourth and fifth delayed clock signals D4 and D5 having the delay amounts larger than the medium delay amount among the first to fifth delayed clock signals D1 to D5. For example, the second logic element group 123B may include first and second OR gates OG1 and OG2. The first OR gate OG1 may perform a logic OR operation on the third delayed clock signal D3 having the medium delay amount and the fourth delayed clock signal D4, and generate the third operation clock signal L3. The second OR gate OG2 may perform the logic OR operation on the third delayed clock signal D3 having the medium delay amount and the fifth delayed clock signal D5, and generate the fourth operation clock signal L4. In addition, the first and second OR gates OG1 and OG2 may be enabled or disabled based on third and fourth power gating signals PG3 and PG4, respectively. Accordingly, power consumed unnecessarily by the first and second OR gates OG1 and OG2 can be saved.

The selection circuit 125 may include a decoder DEC and a multiplexer MUX.

The decoder DEC may decode the control signal CTRL, and generate a selection code signal DO. For example, when the duty cycle of the correction target signal CCL22 has to be decreased, the decoder DEC may generate the selection code signal DO for allowing one of the first and second operation clock signals L1 and L2 to be selected as the second cycle signal CCL2. On the other hand, when the duty cycle of the correction target signal CCL22 has to be increased, the decoder DEC may generate the selection code signal DO for allowing one of the third and fourth operation clock signals L3 and L4 to be selected as the second cycle signal CCL2. In addition, the decoder DEC may generate the first to fourth power gating signals PG1 to PG4. For example, when the first operation clock signal L1 is selected, the decoder DEC may deactivate the first power gating signal PG1, and activate the second to fourth power gating signals PG2 to PG4.

The multiplexer MUX may output one of the first to fourth operation clock signals L1 to L4 as the second cycle signal CCL2 based on the selection code signal DO.

Figure 7:
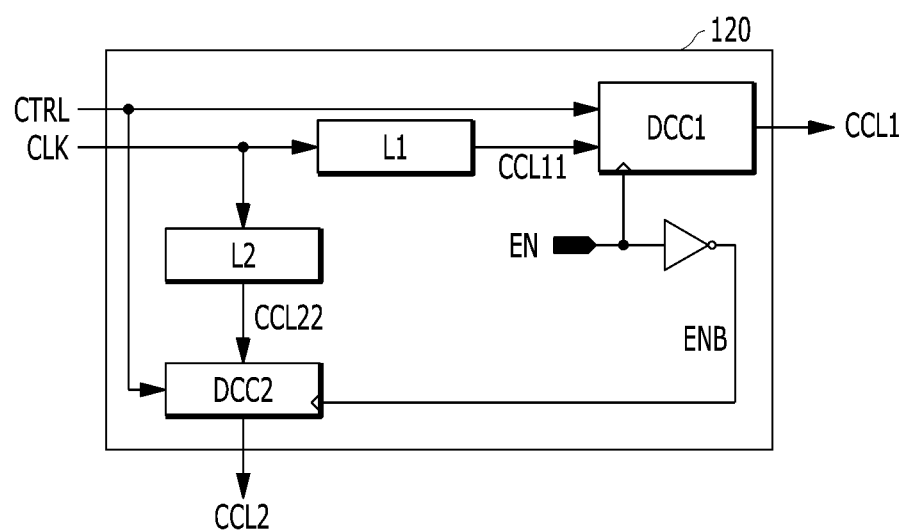
FIG. 7 is a block diagram illustrating still another example of the corrector illustrated in FIG. 2 in accordance with various embodiments of the present invention.

FIG. 7 is a block diagram illustrating still another example of the corrector 120 illustrated in FIG. 2.

Referring to FIG. 7, the corrector 120 may include a first load L1, a first duty cycle correction circuit DCC1, a second load L2 and a second duty cycle correction circuit DCC2.

The first load L1 may generate a first correction target signal CCL11 corresponding to the clock signal CLK. The first load L1 may include a first line load occurring in a first path in which the first correction target signal CCL11 is generated. The first line load may include all loads formed directly or indirectly in the first path. In addition, the first load L1 may be designed to further include a first circuit for tuning the clock signal CLK. A duty cycle of the first correction target signal CCL11 may be changed differently from a duty cycle of the clock signal CLK when passing through the first load L1. That is, the duty cycle of the first correction target signal CCL11 may be unintentionally adjusted.

The first duty cycle correction circuit DCC1 may generate the first cycle signal CCL1 based on the control signal CTRL and the first correction target signal CCL11. For example, the first duty cycle correction circuit DCC1 may generate the first cycle signal CCL1 by correcting the duty cycle of the first correction target signal CCL11 to correspond with a duty cycle of the second cycle signal CCL2. The first duty cycle correction circuit DCC1 may be enabled based on a first enable signal EN. The first enable signal EN may be generated in the image sensor 100 or provided from the controller 200.

The second load L2 may generate a second correction target signal CCL22 corresponding to the clock signal CLK. The second load L2 may include a second line load occurring in a second path in which the second correction target signal CCL22 is generated. The second line load may include all loads formed directly or indirectly in the second path. In addition, the second load L2 may be designed to further include a second circuit for tuning the clock signal CLK. A duty cycle of the second correction target signal CCL22 may be changed differently from the duty cycle of the clock signal CLK when passing through the second load L2. That is, the duty cycle of the second correction target signal CCL22 may be unintentionally adjusted. In this case, the duty cycle of the second correction target signal CCL22 may be different from the duty cycle of the first correction target signal CCL11.

The second duty cycle correction circuit DCC2 may generate the second cycle signal CCL2 based on the control signal CTRL and the second correction target signal CCL22. For example, the second duty cycle correction circuit DCC2 may generate the second cycle signal CCL2 by correcting the duty cycle of the second correction target signal CCL22 to correspond with the duty cycle of the first cycle signal CCL1. The second duty cycle correction circuit DCC2 may be enabled based on a second enable signal ENB. The second enable signal ENB may be a signal obtained by inverting the first enable signal EN.

Figure 8:
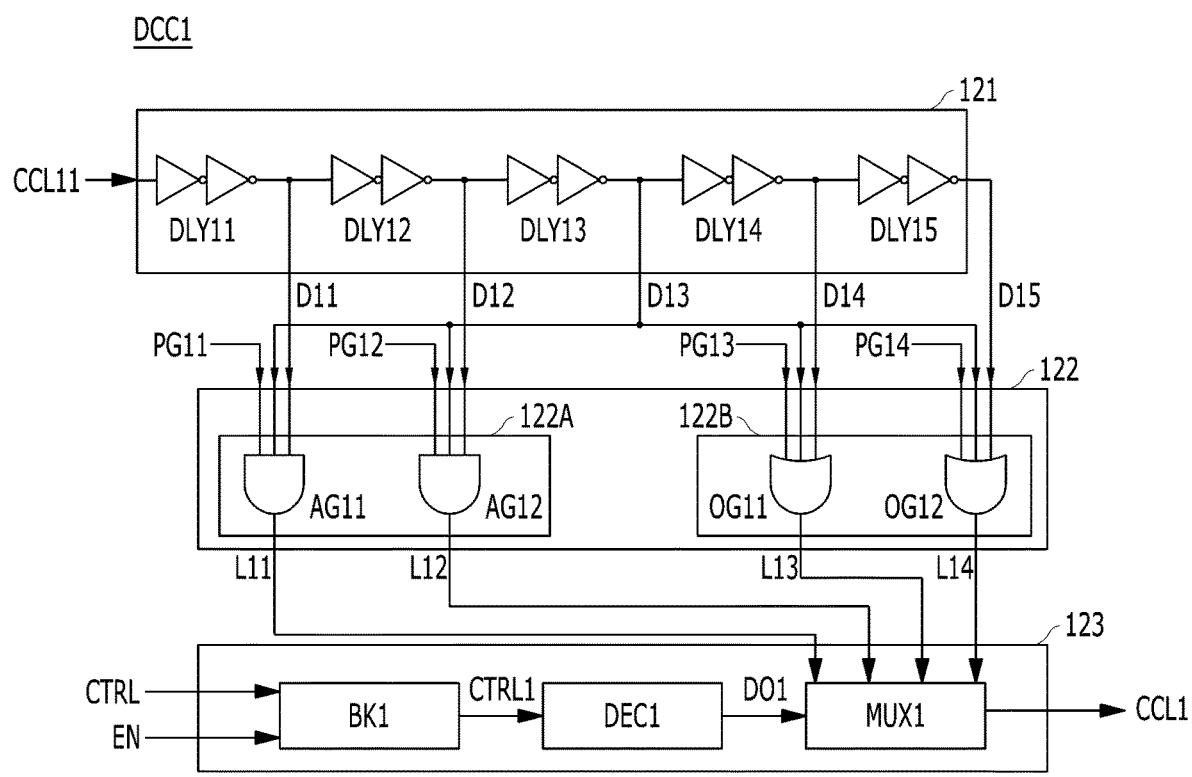
FIG. 8 is a block diagram illustrating a first duty cycle correction circuit illustrated in FIG. 7 in accordance with various embodiments of the present invention.

FIG. 8 is a block diagram illustrating the first duty cycle correction circuit DCC1 illustrated in FIG. 7. The numbers of elements, element groups and signals included in the first duty cycle correction circuit DCC1 of FIG. 8 are described as an example for convenience in description, and that the present disclosure is not limited thereto.

Referring to FIG. 8, the first duty cycle correction circuit DCC1 may include a delay circuit 121, a logic circuit 122 and a selection circuit 123.

The delay circuit 121 may sequentially delay the first correction target signal CCL11 by a unit delay time, and generate first to fifth delayed clock signals D11 to D15. The delay circuit 121 may include first to fifth delay element groups DLY11 to DLY15 coupled in series to one another. Each of the first to fifth delay element groups DLY11 to DLY15 may delay the first correction target signal CCL11 and any one of the former delayed clock signals D11 to D14 by the unit delay time, and output the delayed clock signals D11 to D15. For example, the first delay element group DLY11 may delay the correction target signal CCL11 by the unit delay time to generate the delay clock signal D1. The second delay element group DLY12 may delay the delay clock signal D1 by the unit delay time to generate the delay clock signal D2. The third delay element group DLY13 may delay the delay clock signal D2 by the unit delay time to generate the delay clock signal D3. The fourth delay element group DLY14 may delay the delay clock signal D3 by the unit delay time to generate the delay clock signal D4. The fifth delay element group DLY15 may delay the delay clock signal D4 by the unit delay time to generate the delay clock signal D5. Each of the first to fifth delay element groups DLY11 to DLY15 may include an even number of inverters coupled in series to one another. Although it is described as an example in the present embodiment that each of the delay element groups includes the inverters, the present disclosure is not limited thereto. In various embodiments, each of the delay element groups may be designed to include a resistor and a capacitor.

The logic circuit 122 may perform a logic operation on each of the first to fifth delayed clock signals D11 to D15, and generate first to fourth operation clock signals L11 to L14. The logic circuit 122 may include a first logic element group 122A and a second logic element group 122B.

The first logic element group 122A may generate the first and second operation clock signals L11 and L12 having negative duty cycles, as compared with the clock signal CLK, based on the third delayed clock signal D13 having a medium delay amount and the first and second delayed clock signals D11 and D12 having delay amounts smaller than the medium delay amount among the first to fifth delayed clock signals D11 to D15. For example, the first logic element group 122A may include first and second AND gates AG11 and AG12. The first AND gate AG11 may perform a logic AND operation on the third delayed clock signal D13 having the medium delay amount and the first delayed clock signal D11, and generate the first operation clock signal L11. The second AND gate AG12 may perform the logic AND operation on the third delayed clock signal D13 having the medium delay amount and the second delayed clock signal D12, and generate the second operation clock signal L12. In addition, the first and second AND gates AG11 and AG12 may be enabled or disabled based on first and second power gating signals PG11 and PG12, respectively. Accordingly, power consumed unnecessarily by the first and second AND gates AG11 and AG12 can be saved.

The second logic element group 122B may generate the third and fourth operation clock signals L13 and L14 having positive duty cycles, as compared with the clock signal CLK, based on the third delayed clock signal D13 having the medium delay amount and the fourth and fifth delayed clock signals D14 and D15 having the delay amounts larger than the medium delay amount among the first to fifth delayed clock signals D11 to D15. For example, the second logic element group 122B may include first and second OR gates OG11 and OG12. The first OR gate OG11 may perform a logic OR operation on the third delayed clock signal D13 having the medium delay amount and the fourth delayed clock signal D14, and generate the third operation clock signal L13. The second OR gate OG12 may perform the logic OR operation on the third delayed clock signal D13 having the medium delay amount and the fifth delayed clock signal D15, and generate the fourth operation clock signal L14. In addition, the first and second OR gates OG11 and OG12 may be enabled or disabled based on third and fourth power gating signals PG13 and PG14, respectively. Accordingly, power consumed unnecessarily by the first and second OR gates OG11 and OG12 can be saved.

The selection circuit 123 may include a buffer BK1, a decoder DEC1 and a multiplexer MUX1.

The buffer BK1 may generate a signal CTRL1 based on the control signal CTRL and the first enable signal EN. For example, the buffer BK1 may generate the signal CTRL1 corresponding to the control signal CTRL when the first enable signal EN is activated. On the other hand, when the first enable signal EN is deactivated, the buffer BK1 may maintain the signal CTRL1, which is set regardless of the control signal CTRL.

The decoder DEC1 may decode the signal CTRL1, and generate a selection code signal DO1. For example, when the duty cycle of the first correction target signal CCL11 has to be decreased, the decoder DEC1 may generate the selection code signal DO1 for allowing one of the first and second operation clock signals L11 and L12 to be selected as the first cycle signal CCL1. On the other hand, when the duty cycle of the first correction target signal CCL11 has to be increased, the decoder DEC1 may generate the selection code signal DO1 for allowing one of the third and fourth operation clock signals L13 and L14 to be selected as the first cycle signal CCL1. In addition, the decoder DEC1 may generate the first to fourth power gating signals PG11 to PG14. For example, when the first operation clock signal L11 is selected, the decoder DEC1 may deactivate the first power gating signal PG11, and activate the second to fourth power gating signals PG12 to PG14.

The multiplexer MUX1 may output any one of the first to fourth operation clock signals L11 to L14 as the first cycle signal CCL1 based on the selection code signal DO1.

Figure 9:
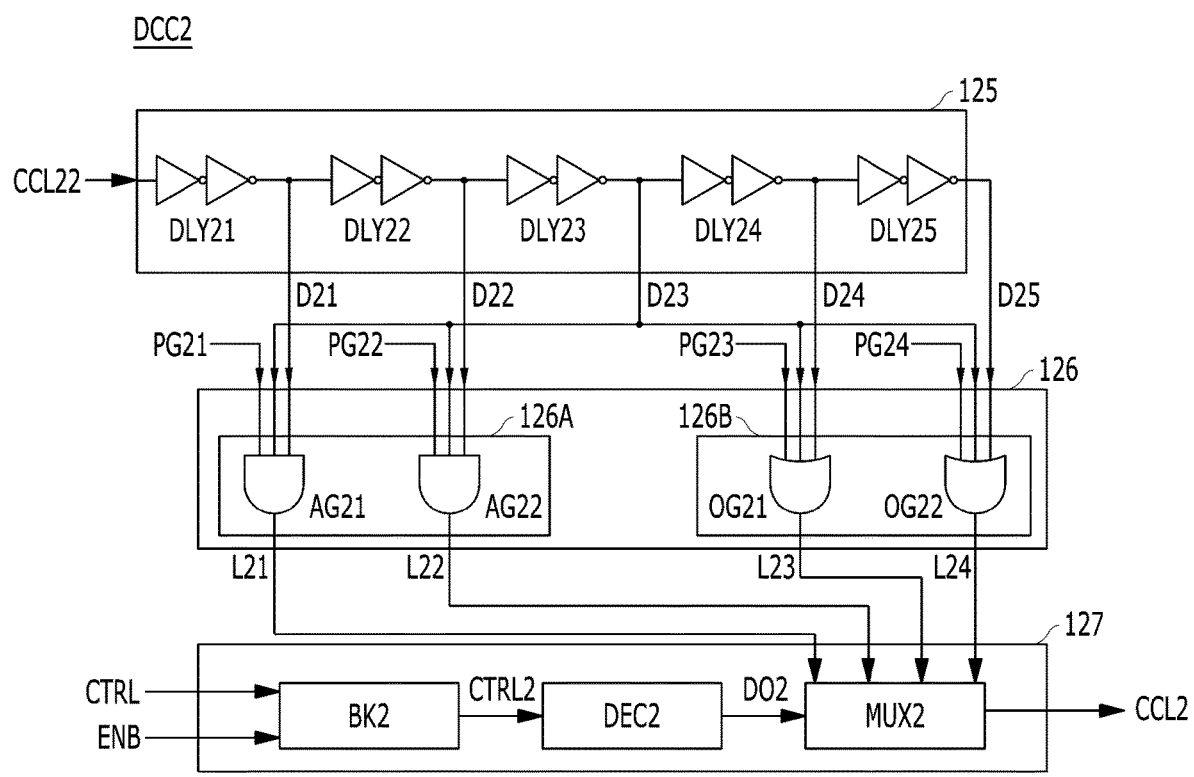
FIG. 9 is a block diagram illustrating a second duty cycle correction circuit illustrated in FIG. 7 in accordance with various embodiments of the present invention.

FIG. 9 is a block diagram illustrating the second duty cycle correction circuit DCC2 illustrated in FIG. 7. It is noted that the number of elements, element groups and signals included in the second duty cycle correction circuit DCC2 of FIG. 9 are described as an example for convenience in description, and that the present disclosure is not limited thereto.

Referring to FIG. 9, the second duty cycle correction circuit DCC2 may include a delay circuit 125, a logic circuit 126 and a selection circuit 127.

The delay circuit 125 may sequentially delay the second correction target signal CCL22 by a unit delay time, and generate first to fifth delayed clock signals D21 to D25. The delay circuit 125 may include first to fifth delay element groups DLY21 to DLY25 coupled in series to one another. For example, the first delay element group DLY21 may delay the correction target signal CCL22 by the unit delay time to generate the delay clock signal D1. The second delay element group DLY22 may delay the delay clock signal D1 by the unit delay time to generate the delay clock signal D2. The third delay element group DLY23 may delay the delay clock signal D2 by the unit delay time to generate the delay clock signal D3. The fourth delay element group DLY24 may delay the delay clock signal D3 by the unit delay time to generate the delay clock signal D4. The fifth delay element group DLY25 may delay the delay clock signal D4 by the unit delay time to generate the delay clock signal D5. Each of the first to fifth delay element groups DLY21 to DLY25 may delay the second correction target signal CCL22 and any one of the former delayed clock signals D21 to D24 by the unit delay time, and output the delayed clock signals D21 to D25. Each of the first to fifth delay element groups DLY21 to DLY25 may include an even number of inverters coupled in series to one another. Although it is described as an example in the present embodiment that each of the delay element groups includes the inverters, the present disclosure is not limited thereto. In various embodiments, each of the delay element groups may be designed to include a resistor and a capacitor.

The logic circuit 126 may perform a logic operation on each of the first to fifth delayed clock signals D21 to D25, and generate first to fourth operation clock signals L21 to L24. The logic circuit 126 may include a first logic element group 126A and a second logic element group 126B.

The first logic element group 126A may generate the first and second operation clock signals L21 and L22 having negative duty cycles, as compared with the clock signal CLK, based on the third delayed clock signal D23 having a medium delay amount and the first and second delayed clock signals D21 and D22 having delay amounts smaller than the medium delay amount among the first to fifth delayed clock signals D21 to D25. For example, the first logic element group 126A may include first and second AND gates AG21 and AG22. The first AND gate AG21 may perform a logic AND operation on the third delayed clock signal D23 having the medium delay amount and the first delayed clock signal D21, and generate the first operation clock signal L21. The second AND gate AG22 may perform the logic AND operation on the third delayed clock signal D23 having the medium delay amount and the second delayed clock signal D22, and generate the second operation clock signal L22. In addition, the first and second AND gates AG21 and AG22 may be enabled or disabled based on first and second power gating signals PG21 and PG22, respectively. Accordingly, power consumed unnecessarily by the first and second AND gates AG21 and AG22 can be saved.

The second logic element group 126B may generate the third and fourth operation clock signals L23 and L24 having positive duty cycles, as compared with the clock signal CLK, based on the third delayed clock signal D23 having the medium delay amount and the fourth and fifth delayed clock signals D24 and D25 having the delay amounts larger than the medium delay amount among the first to fifth delayed clock signals D21 to D25. For example, the second logic element group 126B may include first and second OR gates OG21 and OG22. The first OR gate OG21 may perform a logic OR operation on the third delayed clock signal D23 having the medium delay amount and the fourth delayed clock signal D24, and generate the third operation clock signal L23. The second OR gate OG22 may perform the logic OR operation on the third delayed clock signal D23 having the medium delay amount and the fifth delayed clock signal D25, and generate the fourth operation clock signal L24. In addition, the first and second OR gates OG21 and OG22 may be enabled or disabled based on third and fourth power gating signals PG23 and PG24, respectively. Accordingly, power consumed unnecessarily by the first and second OR gates OG21 and OG22 can be saved.

The selection circuit 127 may include a buffer BK2, a decoder DEC2 and a multiplexer MUX2.

The buffer BK2 may generate a signal CTRL2 based on the control signal CTRL and the second enable signal ENB. For example, the buffer BK2 may generate the signal CTRL2 corresponding to the control signal CTRL when the second enable signal ENB is activated. On the other hand, when the second enable signal ENB is deactivated, the buffer BK2 may maintain the signal CTRL2, which is set regardless of the control signal CTRL.

The decoder DEC2 may decode the signal CTRL2, and generate a selection code signal DO2. For example, when the duty cycle of the second correction target signal CCL22 has to be decreased, the decoder DEC2 may generate the selection code signal DO2 for allowing one of the first and second operation clock signals L21 and L22 to be selected as the second cycle signal CCL2. On the other hand, when the duty cycle of the second correction target signal CCL22 has to be increased, the decoder DEC2 may generate the selection code signal DO2 for allowing one of the third and fourth operation clock signals L23 and L24 to be selected as the second cycle signal CCL2. In addition, the decoder DEC2 may generate the first to fourth power gating signals PG21 to PG24. For example, when the first operation clock signal L21 is selected among the first to fourth operation clock signals L21 to L24, the decoder DEC2 may deactivate the first power gating signal PG21, and activate the second to fourth power gating signals PG22 to PG24.

The multiplexer MUX2 may output any one of the first to fourth operation clock signals L21 to L24 as the second cycle signal CCL2 based on the selection code signal DO2.

Figure 10:
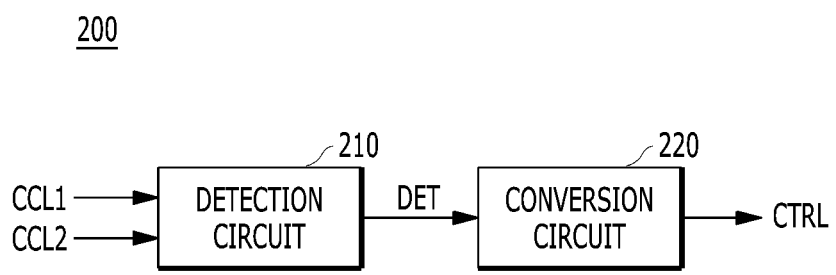
FIG. 10 is a block diagram illustrating a controller illustrated in FIG. 1 in accordance with various embodiments of the present invention.

FIG. 10 is a block diagram illustrating the controller 200 illustrated in FIG. 1.

Referring to FIG. 10, the controller 200 may include a detection circuit 210 and a conversion circuit 220.

The detection circuit 210 may detect a duty cycle difference between the first cycle signal CCL1 and the second cycle signal CCL2. For example, the detection circuit 210 may detect the duty cycle difference by detecting a difference between a period in which the first cycle signal CCL1 is at a logic high level (or a logic low level) and a period in which the second cycle signal CCL2 is at the logic high level (or the logic low level), during a single cycle. The detection circuit 210 may generate a detection signal DET corresponding to the detection result.

The conversion circuit 220 may generate the control signal CTRL corresponding to the detection signal DET. For example, the conversion circuit 220 may convert the detection DET into the control signal CTRL, which is a digital signal.

Hereinafter, an operation of the image sensing device having the above-described configuration in accordance with the present embodiment is described.

In the present embodiment, an operation of the image sensing device including the corrector 120 illustrated in FIG. 3 is representatively described.

In the normal mode, the controller 200 may dynamically generate the control signal CTRL based on the first and second cycle signals CCL1 and CCL2 provided in real time from the image sensor 100. For example, the controller 200 may detect the duty cycle difference between the first cycle signal CCL1 and the second cycle signal CCL2, and generate in real time the control signal CTRL corresponding to the detection result.

The image sensor 100 may correct the depth information based on the control signal CTRL. For example, the image sensor 100 may correct the depth information by removing the duty cycle difference between the first cycle signal CCL1 and the second cycle signal CCL2. Particularly, the corrector 120 included in the image sensor 100 may remove the duty cycle difference between the first cycle signal CCL1 and the second cycle signal CCL2 based on the control signal CTRL.

Figure 11:
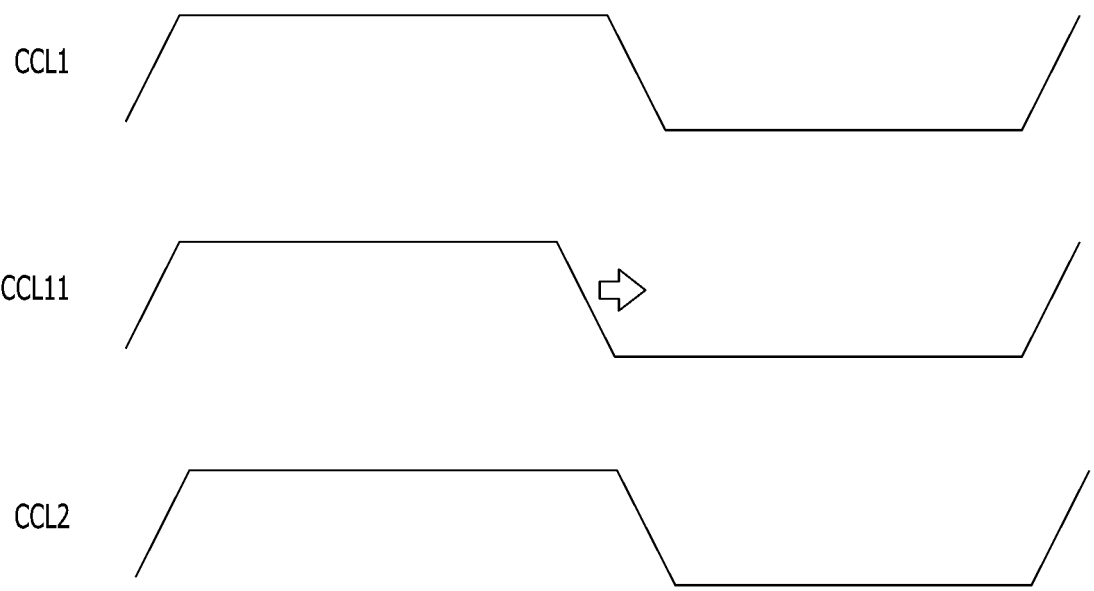
FIG. 11 is a timing diagram illustrating an example of an operation of the image sensing device in accordance with various embodiments of the present invention.

FIG. 11 is a timing diagram illustrating an example of an operation of the corrector 120 illustrated in FIG. 3.

Referring to FIG. 11, the corrector 120 may correct the duty cycle of the correction target signal CCL11, and generate the first cycle signal CCL1, based on the control signal CTRL. In other words, the corrector 120 may generate the first cycle signal CCL1 having a positive duty cycle by correcting the duty cycle of the correction target signal CCL11 according to the duty cycle of the second cycle signal CCL2.

Figure 12:
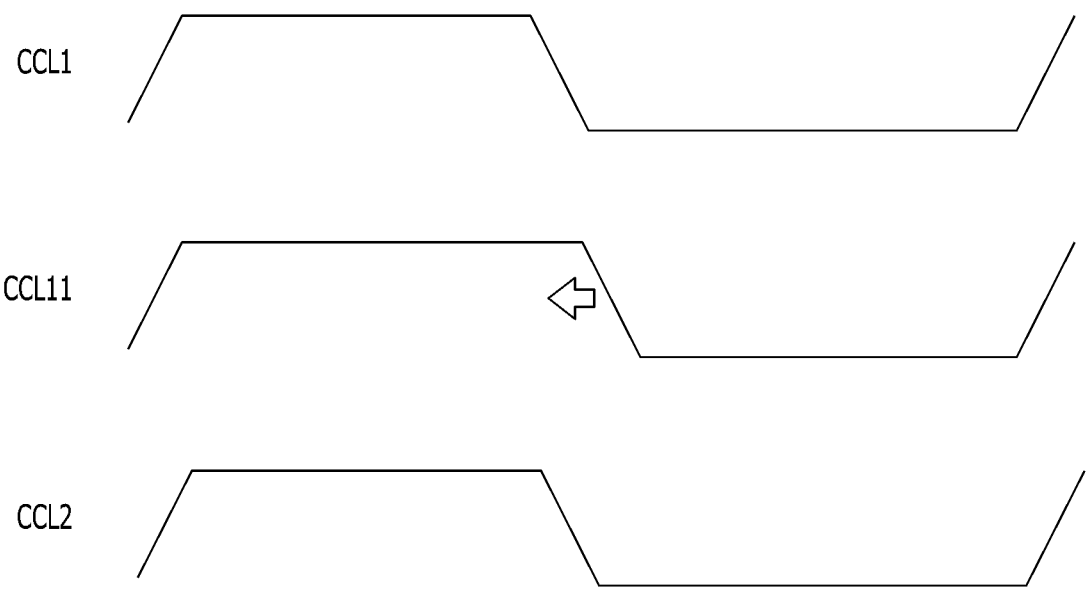
FIG. 12 is a timing diagram illustrating another example of an operation of the image sensing device in accordance with various embodiments of the present invention.

FIG. 12 is a timing diagram illustrating another example of the operation of the corrector 120 illustrated in FIG. 3.

Referring to FIG. 12, the corrector 120 may correct the duty cycle of the correction target signal CCL11, and generate the first cycle signal CCL1, based on the control signal CTRL. In other words, the corrector 120 may generate the first cycle signal CCL1 having a negative duty cycle by correcting the duty cycle of the correction target signal CCL11 according to the duty cycle of the second cycle signal CCL2.

According to the present embodiment, the depth information may be corrected by removing the duty cycle difference between the first cycle signal and the second cycle signal in the normal mode.

Figure 13:
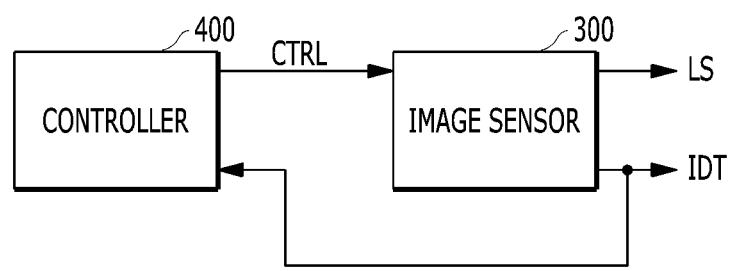
FIG. 13 is a block diagram illustrating an image sensing device in accordance with various embodiments of the present invention.

FIG. 13 is a block diagram illustrating an image sensing device in accordance with various embodiments of the present invention.

Referring to FIG. 13, the image sensing device may include an image sensor 300 and a controller 400.

The image sensor 300 may correct depth information based on a control signal CTRL, and generate image data IDT according to the depth information. The depth information may include information on a distance between the image sensor 300 and a subject (not illustrated).

The controller 400 may analyze an error of the depth information, and generate the control signal CTRL, based on the image data IDT provided from the image sensor 300. In a test mode, the controller 400 may perform an error analysis operation on the depth information at least once, and statically generate the control signal CTRL. The controller 400 may be included in a test device (not illustrated).

Figure 14:
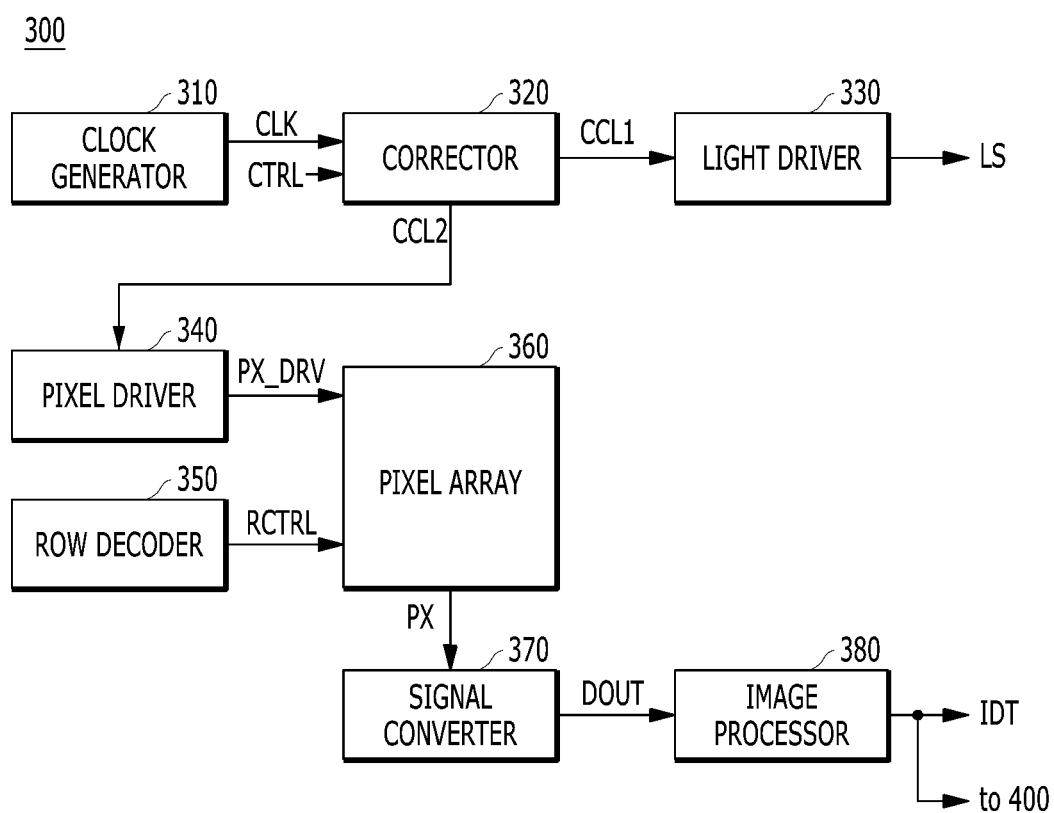
FIG. 14 is a block diagram illustrating an image sensor illustrated in FIG. 13 in accordance with various embodiments of the present invention.

FIG. 14 is a block diagram illustrating the image sensor 300 illustrated in FIG. 13.

Referring to FIG. 14, the image sensor 300 may include a clock generator 310, a corrector 320, a light driver 330, a pixel driver 340, a row decoder 350, a pixel array 360, a signal converter 370 and an image processor 380.

The clock generator 310 may generate a clock signal CLK in the test mode. For example, the clock generator 310 may include a phase locked loop or an oscillator.

The corrector 320 may generate first and second cycle signals CCL1 and CCL2 each having a duty cycle based on the control signal CTRL and the clock signal CLK. The first and second cycle signals CCL1 and CCL2 may be designed to have the same duty cycle. Alternatively, the first and second cycle signals CCL1 and CCL2 may be designed to have different duty cycles. In the present embodiment, it is described as an example that the first and second cycle signals CCL1 and CCL2 are designed to have the same duty cycle.

The light driver 330 may emit a light signal LS to the subject based on the first cycle signal CCL1. For example, the light driver 330 may include a light emitting diode or a laser diode.

The pixel driver 340 may generate a pixel driving signal PX_DRV based on the second cycle signal CCL2. The pixel driving signal PX_DRV may be one of the signals employed for measuring the depth information.

The row decoder 350 may generate a row control signal RCTRL for controlling the pixel array 360 on a row-by-row basis.

The pixel array 360 may include a plurality of pixels disposed at intersections of a plurality of rows and a plurality of columns. The plurality of pixels may include at least one depth measuring pixel for measuring the depth information. The depth measuring pixel may sense a light signal (not illustrated) reflected from the subject, based on the pixel driving signal PX_DRV. In other words, the depth measuring pixel may generate a pixel signal PX corresponding to the depth information, based on the pixel driving signal PX_DRV and the reflected light signal.

The signal converter 370 may convert the pixel signal PX into a digital signal DOUT. For example, the signal converter 370 may include a correlated double sampling circuit and an analog-to-digital converter.

The image processor 380 may generate the image data IDT based on the digital signal DOUT. The image data IDT may include the depth information.

Figure 15:
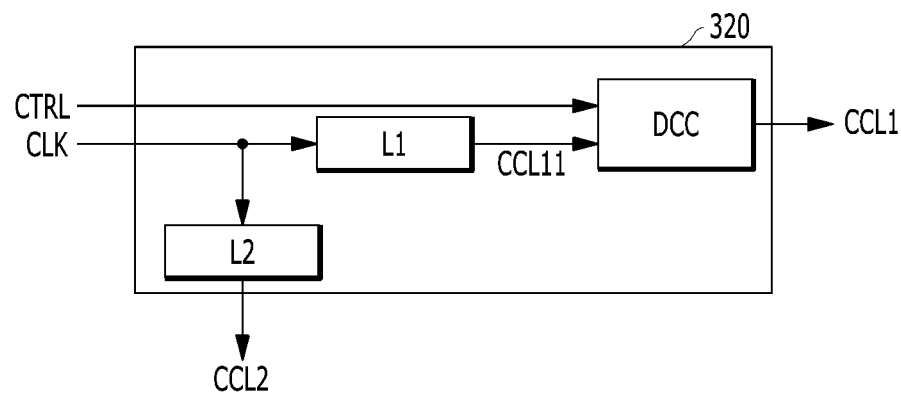
FIG. 15 is a block diagram illustrating an example of a corrector illustrated in FIG. 14 in accordance with various embodiments of the present invention.

FIG. 15 is a block diagram illustrating an example of the corrector 320 illustrated in FIG. 14.

Referring to FIG. 15, the corrector 320 may include a first load L1, a duty cycle correction circuit DCC and a second load L2. Since the first load L1, the duty cycle correction circuit DCC and the second load L2 illustrated in FIG. 15 are the same as those illustrated in FIG. 3, respectively, detailed descriptions thereof are omitted.

Figure 16:
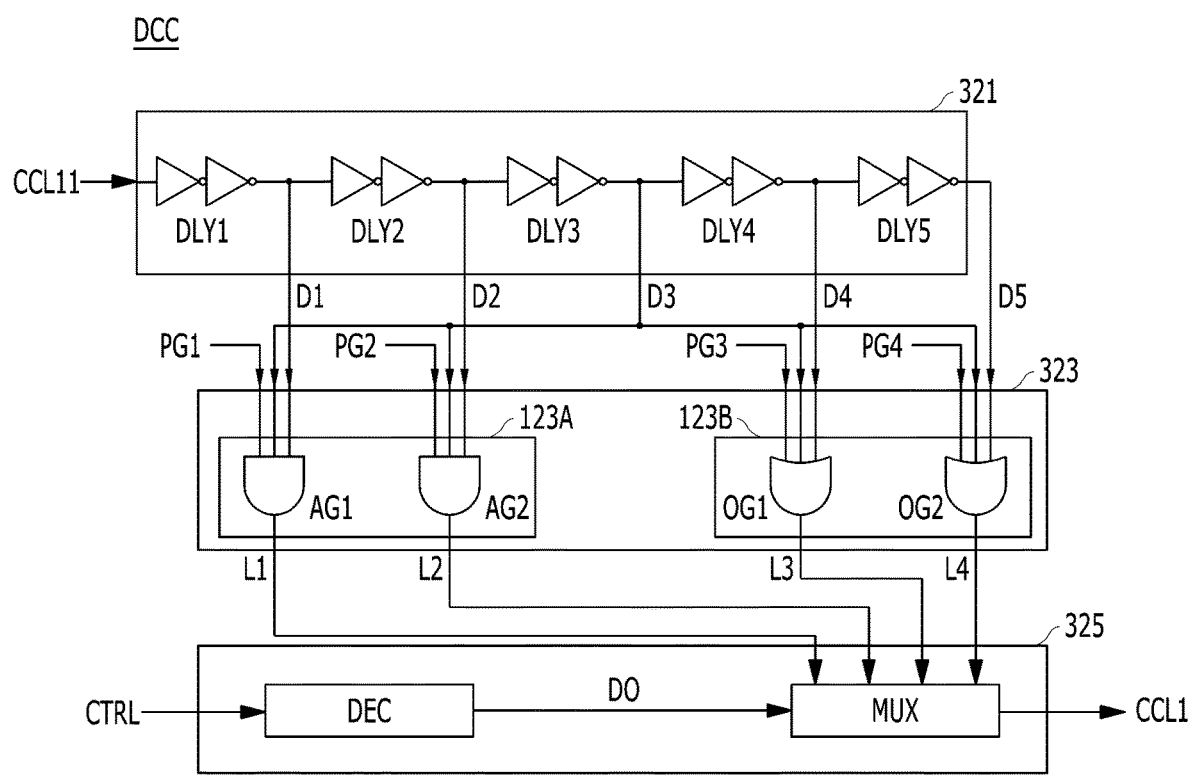
FIG. 16 is a block diagram illustrating a duty cycle correction circuit illustrated in FIG. 15 in accordance with various embodiments of the present invention.

FIG. 16 is a block diagram illustrating the duty cycle correction circuit DCC illustrated in FIG. 15. It is noted that the number of elements, element groups and signals included in the duty cycle correction circuit DCC of FIG. 16 are described as an example for convenience in description, and that the present disclosure is not limited thereto.

Referring to FIG. 16, the duty cycle correction circuit DCC may include a delay circuit 321, a logic circuit 323 and a selection circuit 325. Since the delay circuit 321, the logic circuit 323 and the selection circuit 325 illustrated in FIG. 16 are the same as the delay circuit 121, the logic circuit 123 and the selection circuit 125 illustrated in FIG. 4, respectively, detailed descriptions thereof are omitted.

Figure 17:
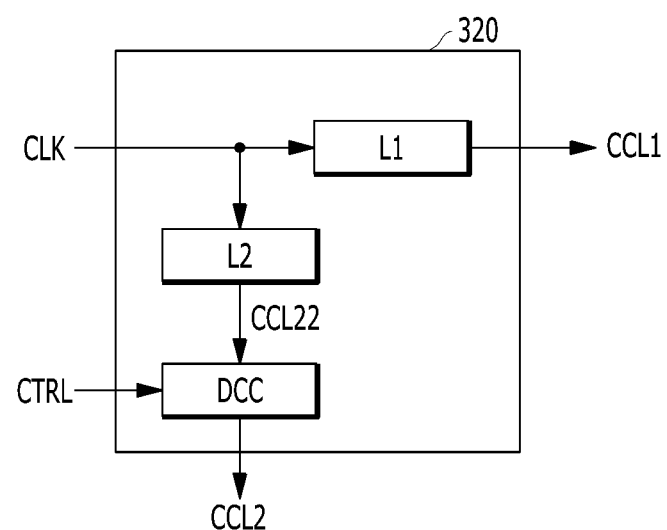
FIG. 17 is a block diagram illustrating another example of the corrector illustrated in FIG. 14 in accordance with various embodiments of the present invention.

FIG. 17 is a block diagram illustrating another example of the corrector 320 illustrated in FIG. 14.

Referring to FIG. 17, the corrector 320 may include a first load L1, a second load L2 and a duty cycle correction circuit DCC. Since the first load L1, the second load L2 and the duty cycle correction circuit DCC illustrated in FIG. 17 are the same as those illustrated in FIG. 5, respectively, detailed descriptions thereof are omitted.

Figure 18:
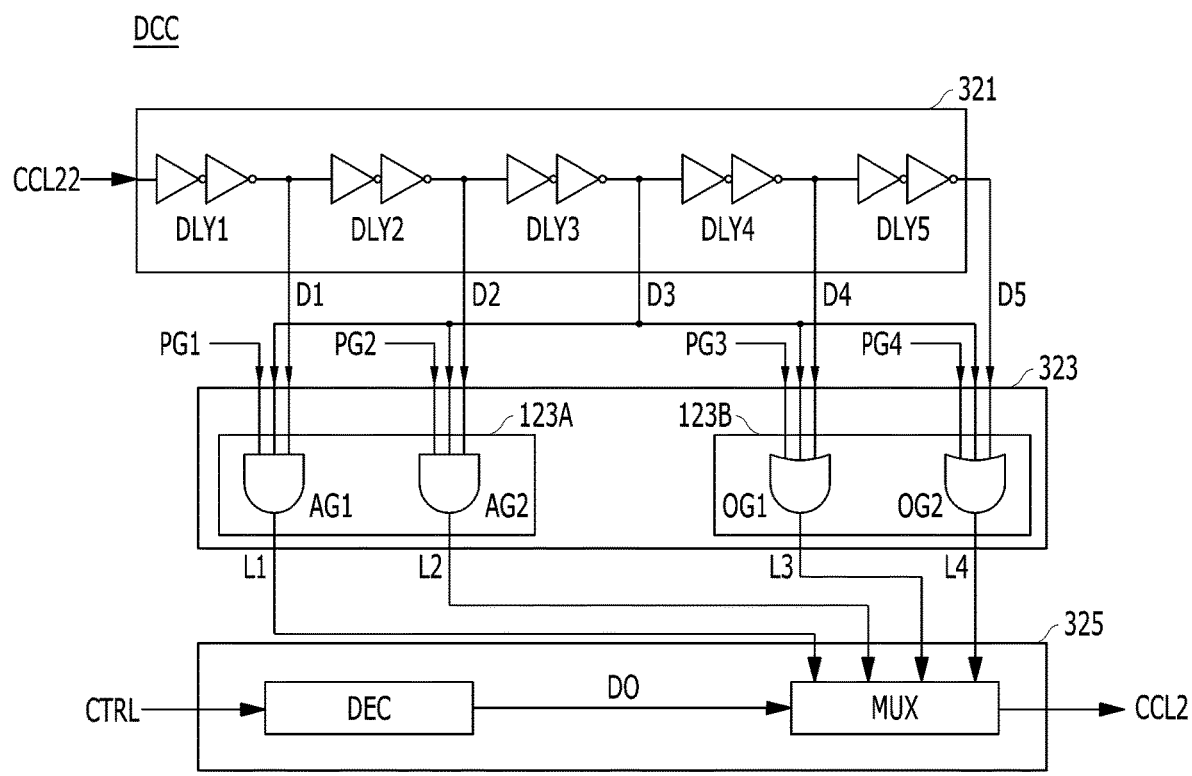
FIG. 18 is a block diagram illustrating a duty cycle correction circuit illustrated in FIG. 17 in accordance with various embodiments of the present invention.

FIG. 18 is a block diagram illustrating the duty cycle correction circuit DCC illustrated in FIG. 17. It is noted that the number of elements, element groups and signals included in the duty cycle correction circuit DCC of FIG. 18 are described as an example for convenience in description, and that the present disclosure is not limited thereto.

Referring to FIG. 18, the duty cycle correction circuit DCC may include a delay circuit 321, a logic circuit 323 and a selection circuit 325. Since the delay circuit 321, the logic circuit 323 and the selection circuit 325 illustrated in FIG. 18 are the same as the delay circuit 121, the logic circuit 123 and the selection circuit 125 illustrated in FIG. 6, respectively, detailed descriptions thereof are omitted.

Figure 19:
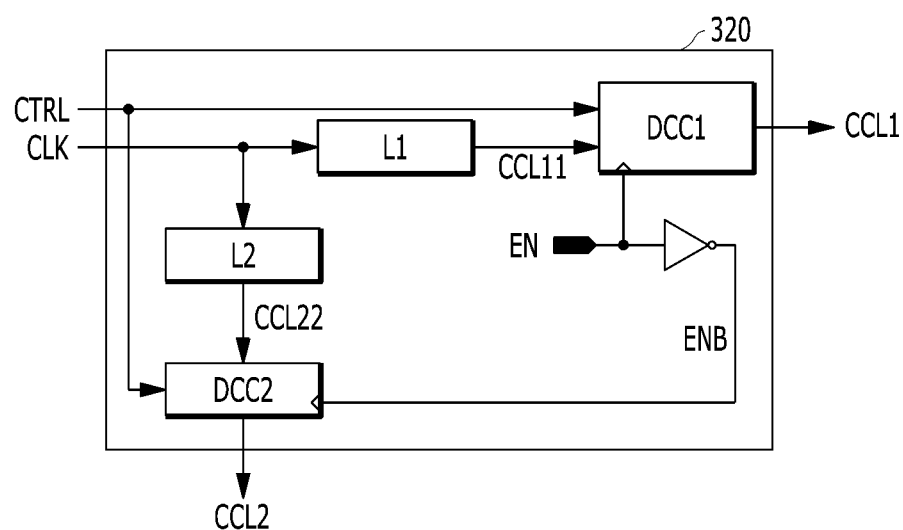
FIG. 19 is a block diagram illustrating still another example of the corrector illustrated in FIG. 14 in accordance with various embodiments of the present invention.

FIG. 19 is a block diagram illustrating still another example of the corrector 320 illustrated in FIG. 14.

Referring to FIG. 19, the corrector 320 may include a first load L1, a first duty cycle correction circuit DCC1, a second load L2 and a second duty cycle correction circuit DCC2. Since the first load L1, the first duty cycle correction circuit DCC1, the second load L2 and the second duty cycle correction circuit DCC2 illustrated in FIG. 19 are the same as those illustrated in FIG. 7, respectively, detailed descriptions thereof are omitted.

Figure 20:
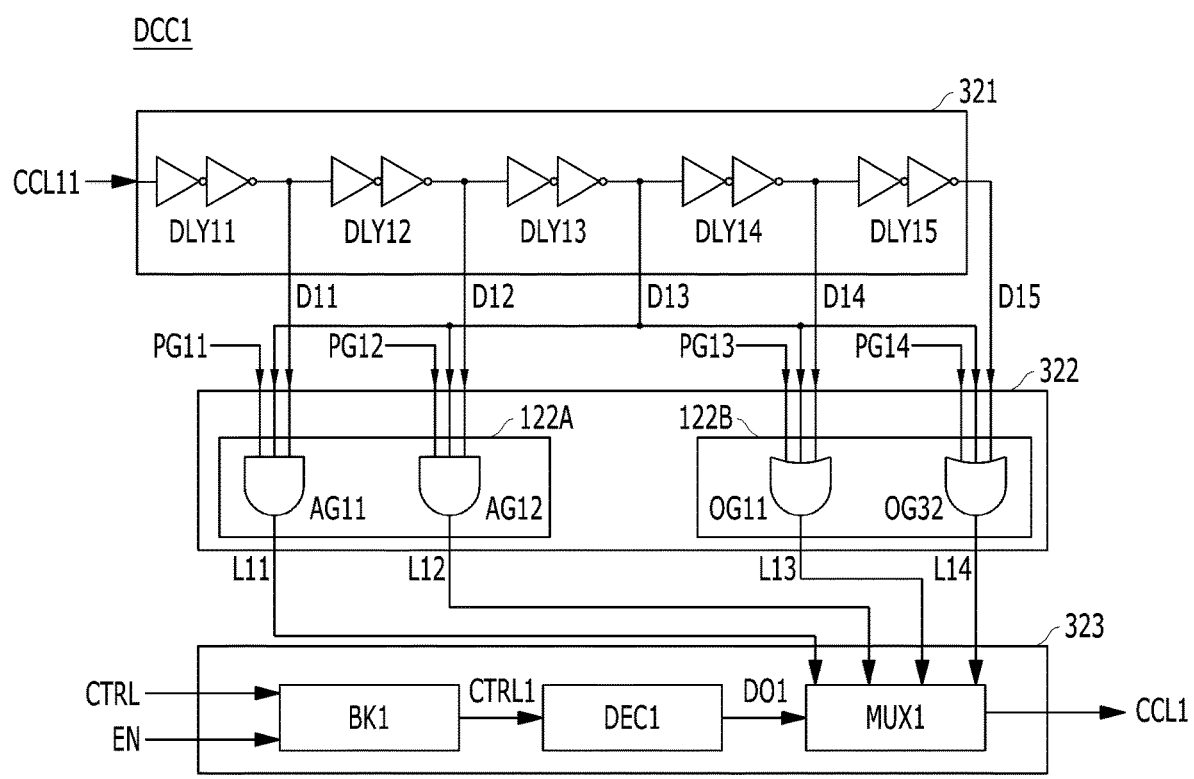
FIG. 20 is a block diagram illustrating a first duty cycle correction circuit illustrated in FIG. 19 in accordance with various embodiments of the present invention.

FIG. 20 is a block diagram illustrating the first duty cycle correction circuit DCC1 illustrated in FIG. 19. It is noted that the number of elements, element groups and signals included in the first duty cycle correction circuit DCC1 of FIG. 20 are described as an example for convenience in description, and that the present disclosure is not limited thereto.

Referring to FIG. 20, the first duty cycle correction circuit DCC1 may include a delay circuit 321, a logic circuit 322 and a selection circuit 323. Since the delay circuit 321, the logic circuit 322 and the selection circuit 323 illustrated in FIG. 20 are the same as the delay circuit 121, the logic circuit 122 and the selection circuit 123 illustrated in FIG. 8, respectively, detailed descriptions thereof are omitted.

Figure 21:
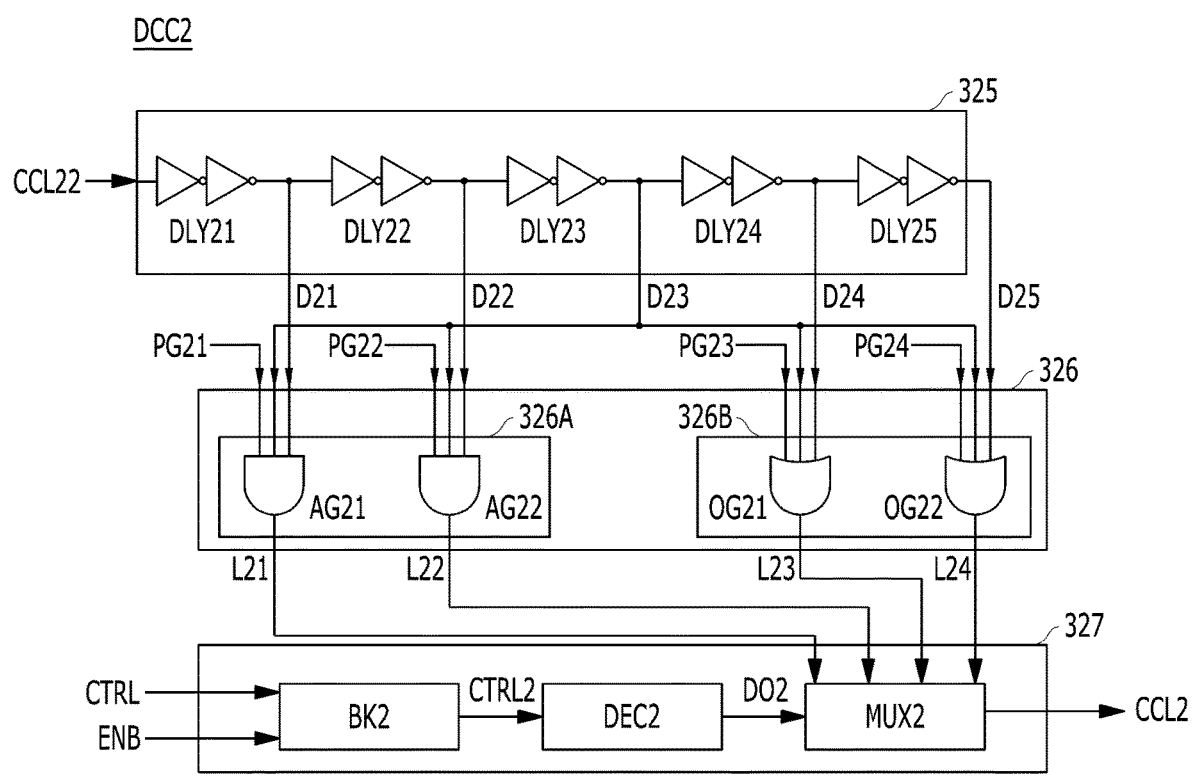
FIG. 21 is a block diagram illustrating a second duty cycle correction circuit illustrated in FIG. 19 in accordance with various embodiments of the present invention.

FIG. 21 is a block diagram illustrating the second duty cycle correction circuit DCC2 illustrated in FIG. 19. It is noted that the number of elements, element groups and signals included in the second duty cycle correction circuit DCC2 of FIG. 21 are described as an example for convenience in description, and that the present disclosure is not limited thereto.

Referring to FIG. 21, the second duty cycle correction circuit DCC2 may include a delay circuit 325, a logic circuit 326 and a selection circuit 327. Since the delay circuit 325, the logic circuit 326 and the selection circuit 327 illustrated in FIG. 21 are the same as the delay circuit 125, the logic circuit 126 and the selection circuit 127 illustrated in FIG. 9, respectively, detailed descriptions thereof are omitted.

Figure 22:
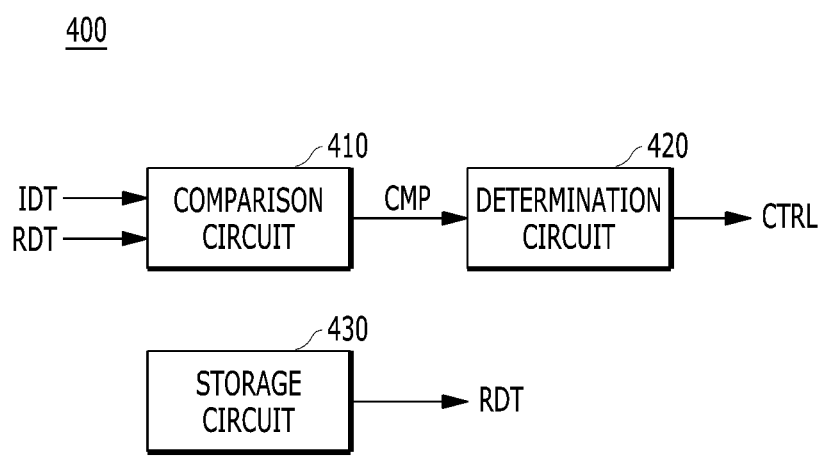
FIG. 22 is a block diagram illustrating a controller illustrated in FIG. 13 in accordance with various embodiments of the present invention.

FIG. 22 is a block diagram illustrating the controller 400 illustrated in FIG. 13.

Referring to FIG. 22, the controller 400 may include a comparison circuit 410, a determination circuit 420 and a storage circuit 430.

The comparison circuit 410 may compare the image data IDT with reference data RDT, and generate a comparison signal CMP. For example, the comparison circuit 410 may compare some or all of digital values, each corresponding to the digital signal DOUT, included in the image data IDT, with digital values included in the reference data RDT.

The determination circuit 420 may determine the error of the depth information, and generate the control signal CTRL, based on the comparison signal CMP. For example, when the determination result indicates "fail", the determination circuit 420 may change the control signal CTRL, and when the determination result indicates "pass", the determination circuit 420 may maintain (i.e., fix) the control signal CTRL.

The storage circuit 430 may store the reference data RDT. Although it is described in the embodiment of the present disclosure that the storage circuit 430 may be configured in the controller 400, the inventive concept is not limited to this, and the storage circuit 430 may be configured outside the controller 400.

Hereinafter, an operation of the image sensing device having the above-described configuration in accordance with the present embodiment is described.

In the present embodiment, an operation of the image sensing device including the corrector 320 illustrated in FIG. 15 is representatively described.

In the test mode, the controller 400 may statically generate the control signal CTRL based on the image data IDT provided from the image sensor 300. For example, the controller 400 may compare the image data IDT with the reference data RDT, and generate the control signal CTRL, corresponding to the comparison result, at least once.

The image sensor 300 may correct the depth information based on the control signal CTRL. For example, the image sensor 300 may correct the depth information by removing a duty cycle difference between the first cycle signal CCL1 and the second cycle signal CCL2. Particularly, the corrector 320 included in the image sensor 300 may remove the duty cycle difference between the first cycle signal CCL1 and the second cycle signal CCL2 based on the control signal CTRL.

Figure 23:
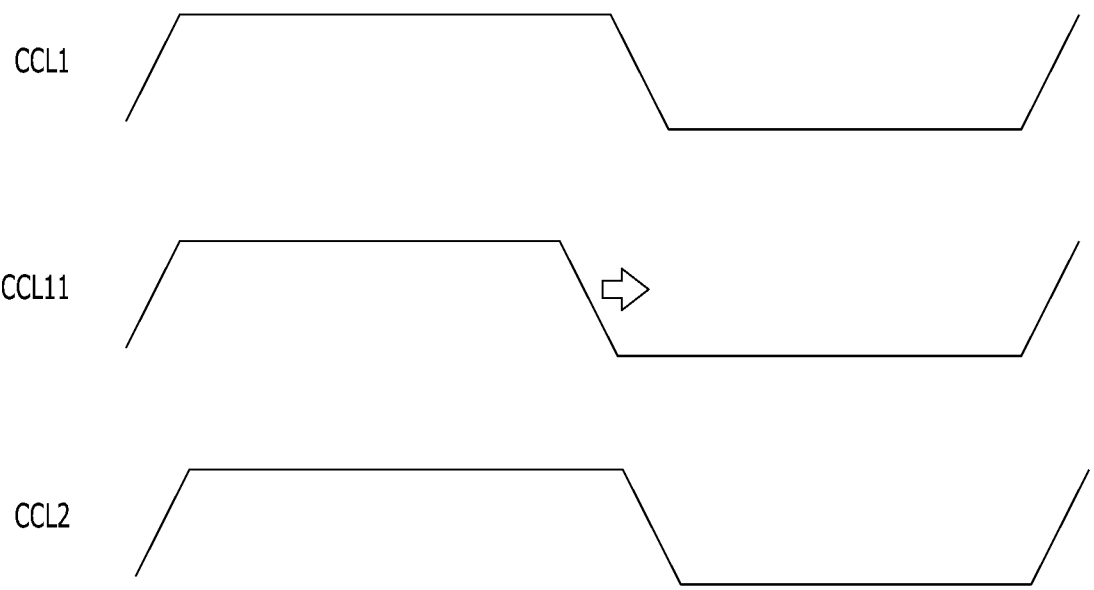
FIG. 23 is a timing diagram illustrating an example of an operation of the image sensing device in accordance with various embodiments of the present invention.

FIG. 23 is a timing diagram illustrating an example of an operation of the corrector 320 illustrated in FIG. 15.

Referring to FIG. 23, the corrector 320 may correct a duty cycle of a correction target signal CCL11, and generate the first cycle signal CCL1, based on the control signal CTRL. In other words, the corrector 320 may generate the first cycle signal CCL1 having a positive duty cycle by correcting the duty cycle of the correction target signal CCL11 according to the duty cycle of the second cycle signal CCL2.

Figure 24:
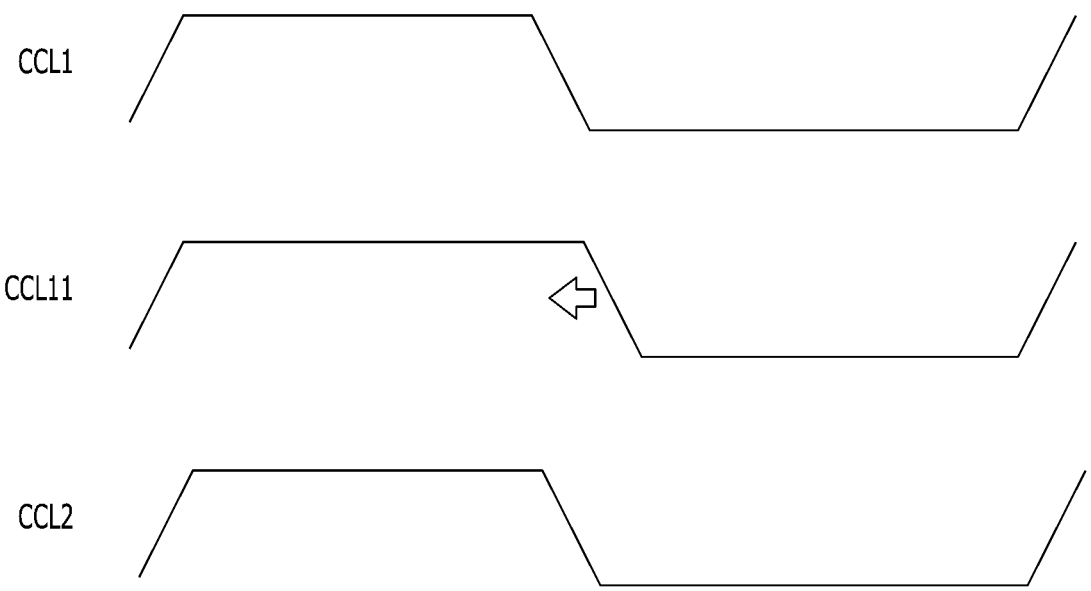
FIG. 24 is a timing diagram illustrating another example of an operation of the image sensing device in accordance with various embodiments of the present invention.

FIG. 24 is a timing diagram illustrating another example of the operation of the corrector 320 illustrated in FIG. 15.

Referring to FIG. 24, the corrector 320 may correct the duty cycle of the correction target signal CCL11, and generate the first cycle signal CCL1, based on the control signal CTRL. In other words, the corrector 320 may generate the first cycle signal CCL1 having a negative duty cycle by correcting the duty cycle of the correction target signal CCL11 according to the duty cycle of the second cycle signal CCL2.

According to the present embodiment, the depth information may be corrected by easily removing the duty cycle difference between the first cycle signal and the second cycle signal in the test mode.

Figure 25:
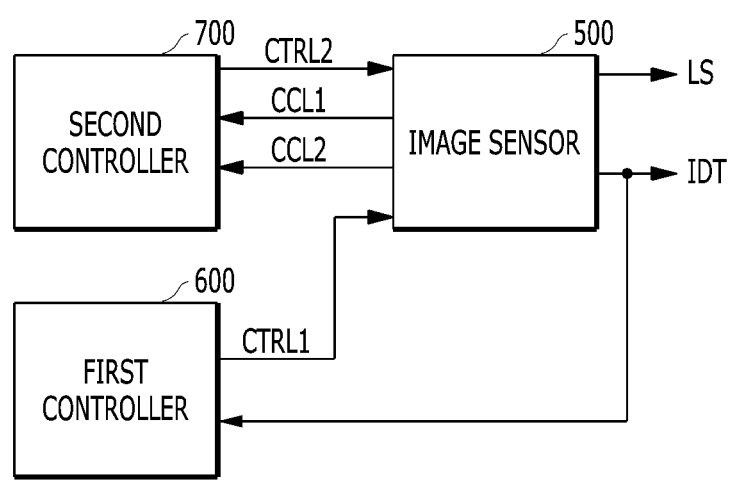
FIG. 25 is a block diagram illustrating an image sensing device in accordance with various embodiments of the present invention.

FIG. 25 is a block diagram illustrating an image sensing device in accordance with various embodiments of the present invention.

Referring to FIG. 25, the image sensing device may include an image sensor 500, a first controller 600 and a second controller 700.

The image sensor 500 may correct depth information based on first and second control signals CTRL1 and CTRL2, and generate image data IDT according to the depth information. The depth information may include information on a distance between the image sensor 500 and a subject (not illustrated).

The image sensor 500 may provide the first controller 600 with the image data IDT in a test mode and the second controller 700 with first and second cycle signals CCL1 and CCL2 required when generating the image data IDT in a normal mode. The first cycle signal CCL1 may be used to generate a light signal LS emitted to the subject (not illustrated). The second cycle signal CCL2 may be used to measure the depth information.

The first controller 600 may analyze an error of the depth information, and generate the first control signal CTRL1, based on the image data IDT provided from the image sensor 500. In the test mode, the first controller 600 may perform an error analysis operation on the depth information at least once, and statically generate the first control signal CTRL1. The first controller 600 may be included in a test device (not illustrated).

The second controller 700 may analyze an error of the depth information, and generate the second control signal CTRL2, based on the first and second cycle signals CCL1 and CCL2 provided from the image sensor 500. In the normal mode, the second controller 700 may perform an error analysis operation on the depth information in real time, and dynamically generate the second control signal CTRL2. The second controller 700 and the image sensor 500 may be integrated into the same chip (i.e., on-chip) or different chips (i.e., off-chip).

Figure 26:
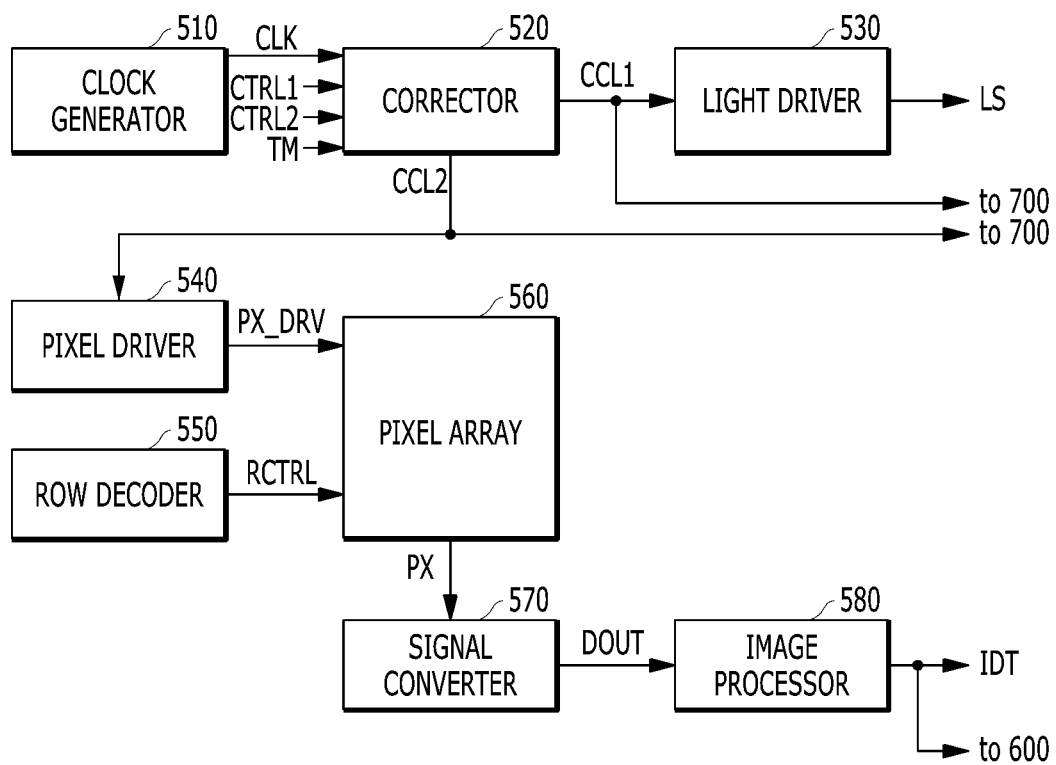
FIG. 26 is a block diagram illustrating an image sensor illustrated in FIG. 25 in accordance with various embodiments of the present invention.

FIG. 26 is a block diagram illustrating the image sensor 500 illustrated in FIG. 25.

Referring to FIG. 26, the image sensor 500 may include a clock generator 510, a corrector 520, a light driver 530, a pixel driver 540, a row decoder 550, a pixel array 560, a signal converter 570 and an image processor 580.

The clock generator 510 may generate a clock signal CLK in the test and normal modes. For example, the clock generator 510 may include a phase locked loop or an oscillator.

The corrector 520 may generate the first and second cycle signals CCL1 and CCL2 each having a duty cycle based on the first and second control signals CTRL1 and CTRL2, the clock signal CLK and a test mode signal TM. The first and second cycle signals CCL1 and CCL2 may be designed to have the same duty cycle. Alternatively, the first and second cycle signals CCL1 and CCL2 may be designed to have different duty cycles. In the present embodiment, it is described as an example that the first and second cycle signals CCL1 and CCL2 are designed to have the same duty cycle.

The light driver 530 may emit the light signal LS to the subject based on the first cycle signal CCL1. For example, the light driver 530 may include a light emitting diode or a laser diode.

The pixel driver 540 may generate a pixel driving signal PX_DRV based on the second cycle signal CCL2. The pixel driving signal PX_DRV may be one of the signals employed for measuring the depth information.

The row decoder 550 may generate a row control signal RCTRL for controlling the pixel array 560 on a row-by-row basis.

The pixel array 560 may include a plurality of pixels disposed at intersections of a plurality of rows and a plurality of columns. The plurality of pixels may include at least one depth measuring pixel for measuring the depth information. The depth measuring pixel may sense a light signal (not illustrated) reflected from the subject, based on the pixel driving signal PX_DRV. In other words, the depth measuring pixel may generate a pixel signal PX corresponding to the depth information, based on the pixel driving signal PX_DRV and the reflected light signal.

The signal converter 570 may convert the pixel signal PX into a digital signal DOUT. For example, the signal converter 570 may include a correlated double sampling circuit and an analog-to-digital converter.

The image processor 580 may generate the image data IDT based on the digital signal DOUT. The image data IDT may include the depth information.

Figure 27:
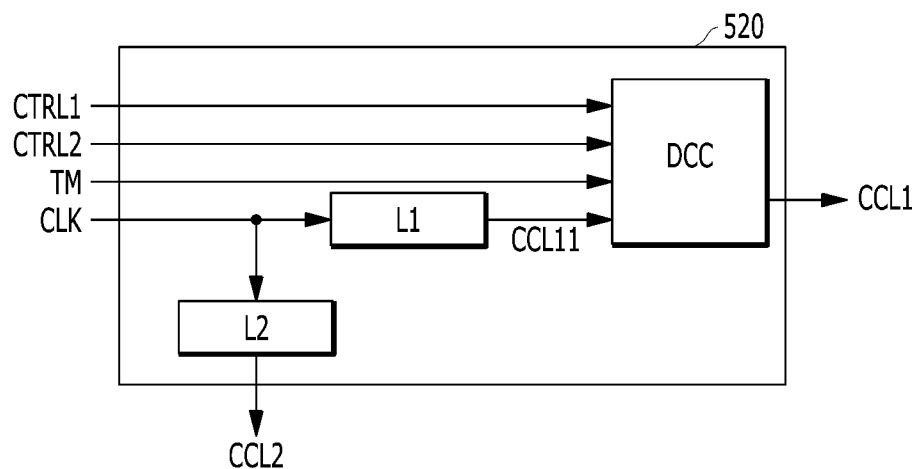
FIG. 27 is a block diagram illustrating an example of a corrector illustrated in FIG. 26 in accordance with various embodiments of the present invention.

FIG. 27 is a block diagram illustrating an example of the corrector 520 illustrated in FIG. 26.

Referring to FIG. 27, the corrector 520 may include a first load L1, a duty cycle correction circuit DCC and a second load L2.

The first load L1 may generate a correction target signal CCL11 corresponding to the clock signal CLK. The first load L1 may include a first line load occurring in a first path in which the correction target signal CCL11 is generated. The first line load may include all loads formed directly or indirectly in the first path. In addition, the first load L1 may be designed to further include a first circuit for tuning the clock signal CLK. A duty cycle of the correction target signal CCL11 may be changed differently from a duty cycle of the clock signal CLK when passing through the first load L1. In other words, the duty cycle of the correction target signal CCL11 may be unintentionally adjusted.

The duty cycle correction circuit DCC may generate the first cycle signal CCL1 based on the first and second control signals CTRL1 and CTRL2, the test mode signal TM and the correction target signal CCL11. For example, the duty cycle correction circuit DCC may statically generate the first cycle signal CCL1 by correcting the duty cycle of the correction target signal CCL11 to correspond with a duty cycle of the second cycle signal CCL2 in the test mode, and dynamically generate the first cycle signal CCL1 by correcting in real time the duty cycle of the correction target signal CCL11 to correspond with a duty cycle of the second cycle signal CCL2 in the normal mode.

The second load L2 may generate the second cycle signal CCL2 corresponding to the clock signal CLK. The second load L2 may include a second line load occurring in a second path in which the second cycle signal CCL2 is generated. The second line load may include all loads formed directly or indirectly in the second path. In addition, the second load L2 may be designed to further include a second circuit for tuning the clock signal CLK. The duty cycle of the second cycle signal CCL2 may be changed differently from the duty cycle of the clock signal CLK when passing through the second load L2. In other words, the duty cycle of the second cycle signal CCL2 may be unintentionally adjusted. In this case, the duty cycle of the second cycle signal CCL2 may be different from the duty cycle of the correction target signal CCL11.

Figure 28:
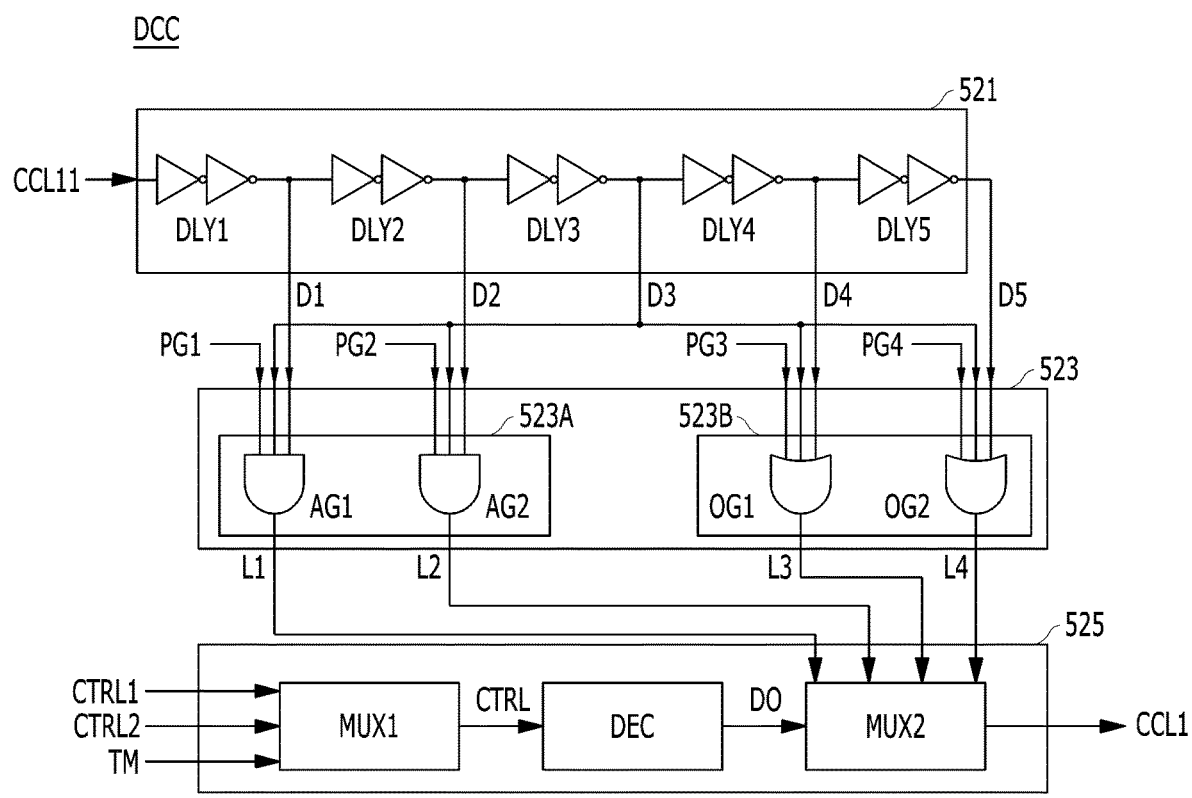
FIG. 28 is a block diagram illustrating a duty cycle correction circuit illustrated in FIG. 27 in accordance with various embodiments of the present invention.

FIG. 28 is a block diagram illustrating the duty cycle correction circuit DCC illustrated in FIG. 27. It is noted that the number of elements, element groups and signals included in the duty cycle correction circuit DCC of FIG. 28 are described as an example for convenience in description, and that the present disclosure is not limited thereto.

Referring to FIG. 28, the duty cycle correction circuit DCC may include a delay circuit 521, a logic circuit 523 and a selection circuit 525. Since the delay circuit 521 and the logic circuit 523 illustrated in FIG. 28 are the same as the delay circuit 121 and the logic circuit 123 illustrated in FIG. 4, respectively, detailed descriptions thereof are omitted.

The selection circuit 525 may include a first multiplexer MUX1, a decoder DEC and a second multiplexer MUX2.

The first multiplexer MUX1 may output one of the first and second control signals CTRL1 and CTRL2 as the control signal CTRL based on the test mode signal TM. For example, the first multiplexer MUX1 may output the first control signal CTRL1 as the control signal CTRL in the test mode, and output the second control signal CTRL2 as the control signal CTRL in the normal mode.

The decoder DEC may decode the control signal CTRL, and generate a selection code signal DO. For example, when the duty cycle of the correction target signal CCL11 has to be decreased, the decoder DEC may generate the selection code signal DO for allowing one of the first and second operation clock signals L1 and L2 to be selected as the first cycle signal CCL1. On the other hand, when the duty cycle of the correction target signal CCL11 has to be increased, the decoder DEC may generate the selection code signal DO for allowing one of the third and fourth operation clock signals L3 and L4 to be selected as the first cycle signal CCL1. In addition, the decoder DEC may generate first to fourth power gating signals PG1 to PG4. For example, when the first operation clock signal L1 is selected, the decoder DEC may deactivate the first power gating signal PG1, and activate the second to fourth power gating signals PG2 to PG4.

The second multiplexer MUX2 may output any one of the first to fourth operation clock signals L1 to L4 as the first cycle signal CCL1 based on the selection code signal DO.

Figure 29:
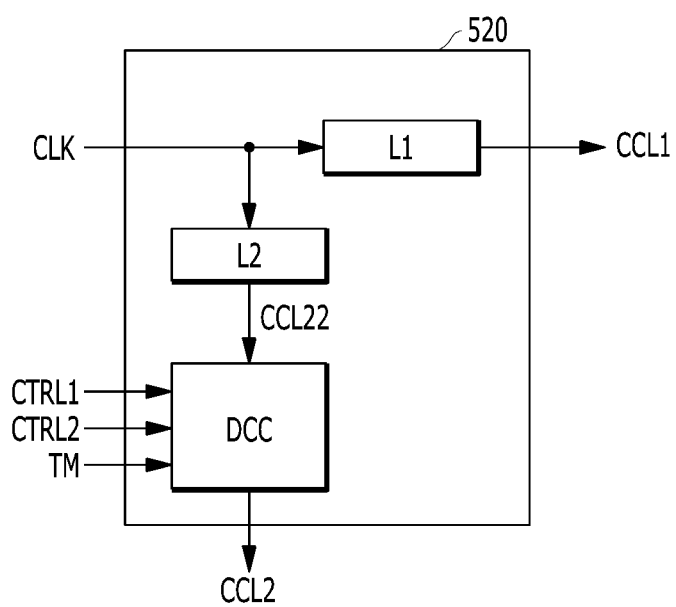
FIG. 29 is a block diagram illustrating another example of the corrector illustrated in FIG. 26 in accordance with various embodiments of the present invention.

FIG. 29 is a block diagram illustrating another example of the corrector 520 illustrated in FIG. 26.

Referring to FIG. 29, the corrector 520 may include a first load L1, a second load L2 and a duty cycle correction circuit DCC.

The first load L1 may generate the first cycle signal CCL1 corresponding to the clock signal CLK. The first load L1 may include a first line load occurring in a first path in which the first cycle signal CCL1 is generated. The first line load may include all loads formed directly or indirectly in the first path. In addition, the first load L1 may be designed to further include a first circuit for tuning the clock signal CLK. A duty cycle of the first cycle signal CCL1 may be changed differently from a duty cycle of the clock signal CLK when passing through the first load L1. In other words, the duty cycle of the first cycle signal CCL1 may be unintentionally adjusted.

The second load L2 may generate a correction target signal CCL22 corresponding to the clock signal CLK. The second load L2 may include a second line load occurring in a second path in which the correction target signal CCL22 is generated. The second line load may include all loads formed directly or indirectly in the second path. In addition, the second load L2 may be designed to further include a second circuit for tuning the clock signal CLK. A duty cycle of the correction target signal CCL22 may be changed differently from the duty cycle of the clock signal CLK when passing through the second load L2. In other words, the duty cycle of the correction target signal CCL22 may be unintentionally adjusted. In this case, the duty cycle of the correction target signal CCL22 may be different from the duty cycle of the first cycle signal CCL1.

The duty cycle correction circuit DCC may generate the second cycle signal CCL2 based on the first and second control signals CTRL1 and CTRL2, the test mode signal TM and the correction target signal CCL22. For example, the duty cycle correction circuit DCC may statically generate the second cycle signal CCL2 by correcting the duty cycle of the correction target signal CCL22 to correspond with the duty cycle of the first cycle signal CCL1 in the test mode, and dynamically generate the second cycle signal CCL2 by correcting in real time the duty cycle of the correction target signal CCL22 to correspond with the duty cycle of the first cycle signal CCL1 in the normal mode.

Figure 30:
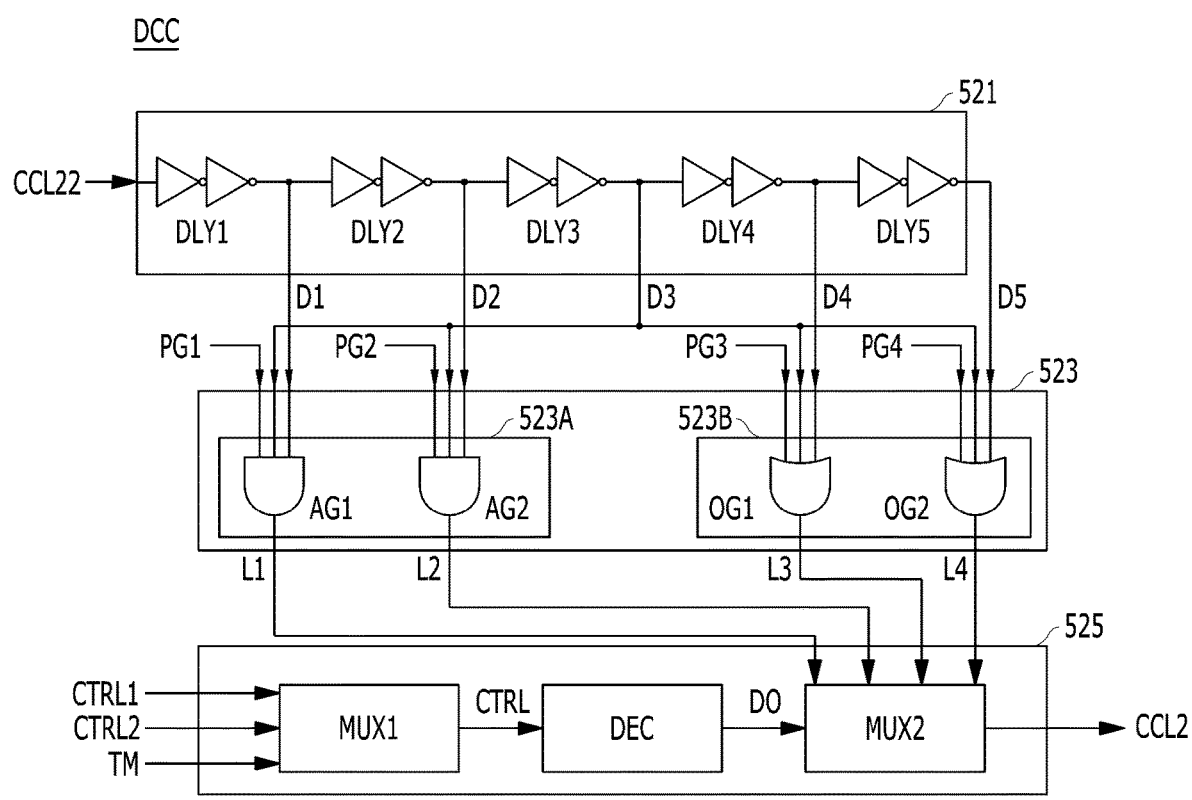
FIG. 30 is a block diagram illustrating a duty cycle correction circuit illustrated in FIG. 29 in accordance with various embodiments of the present invention.

FIG. 30 is a block diagram illustrating the duty cycle correction circuit DCC illustrated in FIG. 29. It is noted that the number of elements, element groups and signals included in the duty cycle correction circuit DCC of FIG. 30 are described as an example for convenience in description, and that the present disclosure is not limited thereto.

Referring to FIG. 30, the duty cycle correction circuit DCC may include a delay circuit 521, a logic circuit 523 and a selection circuit 525. Since the delay circuit 521 and the logic circuit 523 illustrated in FIG. 30 are the same as the delay circuit 121 and the logic circuit 123 illustrated in FIG. 6, respectively, detailed descriptions thereof are omitted.

The selection circuit 525 may include a first multiplexer MUX1, a decoder DEC and a second multiplexer MUX2.

The first multiplexer MUX1 may output one of the first and second control signals CTRL1 and CTRL2 as the control signal CTRL based on the test mode signal TM. For example, the first multiplexer MUX1 may output the first control signal CTRL1 as the control signal CTRL in the test mode, and output the second control signal CTRL2 as the control signal CTRL in the normal mode.

The decoder DEC may decode the control signal CTRL and generate a selection code signal DO. For example, when the duty cycle of the correction target signal CCL22 has to be decreased, the decoder DEC may generate the selection code signal DO for allowing one of the first and second operation clock signals L1 and L2 to be selected as the first cycle signal CCL1. On the other hand, when the duty cycle of the correction target signal CCL22 has to be increased, the decoder DEC may generate the selection code signal DO for allowing one of the third and fourth operation clock signals L3 and L4 to be selected as the first cycle signal CCL1. In addition, the decoder DEC may generate first to fourth power gating signals PG1 to PG4. For example, when the first operation clock signal L1 is selected among the first to fourth operation clock signals L1 to L4, the decoder DEC may deactivate the first power gating signal PG1, and activate the second to fourth power gating signals PG2 to PG4.

The second multiplexer MUX2 may output any one of the first to fourth operation clock signals L1 to L4 as the first cycle signal CCL1 based on the selection code signal DO.

Figure 31:
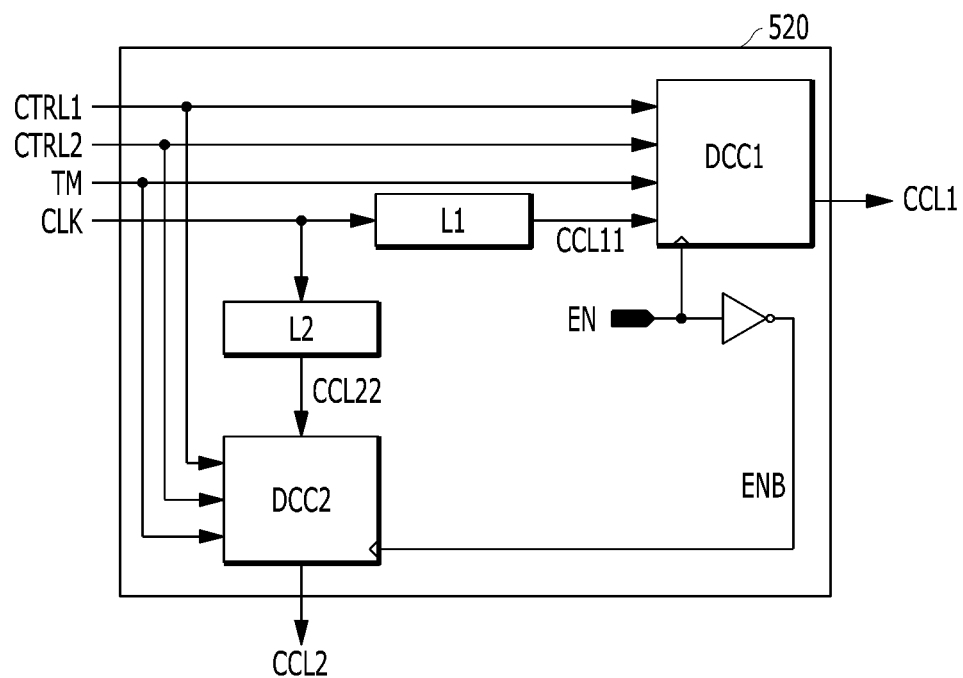
FIG. 31 is a block diagram illustrating still another example of the corrector illustrated in FIG. 26 in accordance with various embodiments of the present invention.

FIG. 31 is a block diagram illustrating another example of the corrector 520 illustrated in FIG. 26.

Referring to FIG. 31, the corrector 520 may include a first load L1, a first duty cycle correction circuit DCC1, a second load L2 and a second duty cycle correction circuit DCC2.

The first load L1 may generate a first correction target signal CCL11 corresponding to the clock signal CLK. The first load L1 may include a first line load occurring in a first path in which the first correction target signal CCL11 is generated. The first line load may include all loads formed directly or indirectly in the first path. In addition, the first load L1 may be designed to further include a first circuit for tuning the clock signal CLK. A duty cycle of the first correction target signal CCL11 may be changed differently from a duty cycle of the clock signal CLK when passing through the first load L1. In other words, the duty cycle of the first correction target signal CCL11 may be unintentionally adjusted.

The first duty cycle correction circuit DCC1 may generate the first cycle signal CCL1 based on the first and second control signals CTRL1 and CTRL2, the test mode signal TM and the first correction target signal CCL11. For example, the first duty cycle correction circuit DCC1 may statically generate the first cycle signal CCL1 by correcting the duty cycle of the first correction target signal CCL11 to correspond with a duty cycle of the second cycle signal CCL2 in the test mode, and dynamically generate the first cycle signal CCL1 by correcting in real time the duty cycle of the first correction target signal CCL11 to correspond with a duty cycle of the second cycle signal CCL2 in the normal mode. The first duty cycle correction circuit DCC1 may be enabled based on a first enable signal EN. The first enable signal EN may be generated in the image sensor 500 or provided from the first and second controllers 600 and 700.

The second load L2 may generate a second correction target signal CCL22 corresponding to the clock signal CLK. The second load L2 may include a second line load occurring in a second path in which the second correction target signal CCL22 is generated. The second line load may include all loads formed directly or indirectly in the second path. In addition, the second load L2 may be designed to further include a second circuit for tuning the clock signal CLK. A duty cycle of the second correction target signal CCL22 may be changed differently from the duty cycle of the clock signal CLK when passing through the second load L2. In other words, the duty cycle of the second correction target signal CCL22 may be unintentionally adjusted. In this case, the duty cycle of the second correction target signal CCL22 may be different from the duty cycle of the first correction target signal CCL11.

The second duty cycle correction circuit DCC2 may generate the second cycle signal CCL2 based on the first and second control signals CTRL1 and CTRL2, the test mode signal TM and the second correction target signal CCL22. For example, the second duty cycle correction circuit DCC2 may statically generate the second cycle signal CCL2 by correcting the duty cycle of the second correction target signal CCL22 to correspond with a duty cycle of the first cycle signal CCL1 in the test mode, and dynamically generate the second cycle signal CCL2 by correcting in real time the duty cycle of the second correction target signal CCL22 to correspond with the duty cycle of the first cycle signal CCL1 in the normal mode. The second duty cycle correction circuit DCC2 may be enabled based on a second enable signal ENB. The second enable signal ENB may be a signal obtained by inverting the first enable signal EN.

Figure 32:
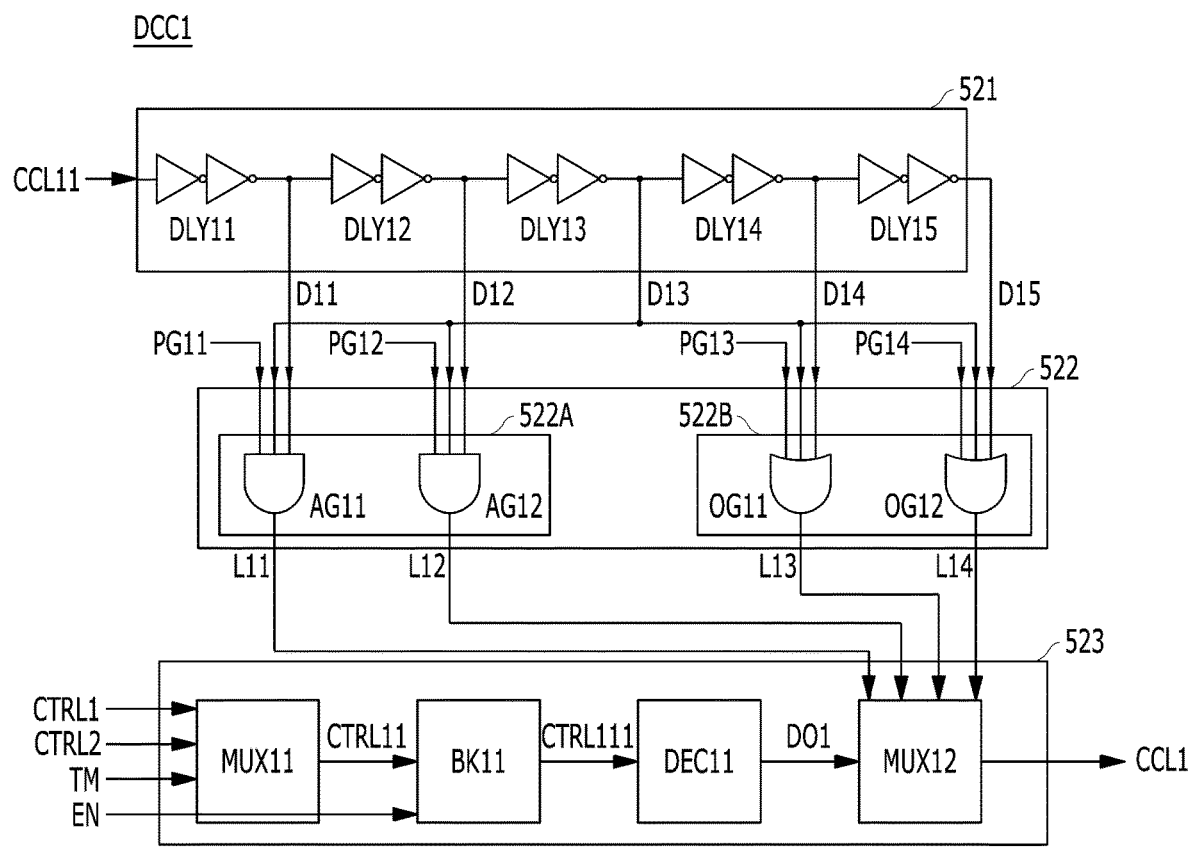
FIG. 32 is a block diagram illustrating a first duty cycle correction circuit illustrated in FIG. 31 in accordance with various embodiments of the present invention.

FIG. 32 is a block diagram illustrating the first duty cycle correction circuit DCC1 illustrated in FIG. 31. It is noted that the number of elements, element groups and signals included in the first duty cycle correction circuit DCC1 of FIG. 32 are described as an example for convenience in description, and that the present disclosure is not limited thereto.

Referring to FIG. 32, the first duty cycle correction circuit DCC1 may include a delay circuit 521, a logic circuit 522 and a selection circuit 523. Since the delay circuit 521 and the logic circuit 522 illustrated in FIG. 32 are the same as the delay circuit 121 and the logic circuit 122 illustrated in FIG. 8, respectively, detailed descriptions thereof are omitted.

The selection circuit 523 may include a first multiplexer MUX11, a buffer BK11, a decoder DEC11 and a second multiplexer MUX12.

The first multiplexer MUX11 may output one of the first and second control signals CTRL1 and CTRL2 as a control signal CTRL11 based on the test mode signal TM. For example, the first multiplexer MUX11 may output the first control signal CTRL1 as the control signal CTRL11 in the test mode, and output the second control signal CTRL2 as the control signal CTRL11 in the normal mode.

The buffer BK11 may generate a signal CTRL111 based on the control signal CTRL11 and the first enable signal EN. For example, the buffer BK11 may generate the signal CTRL111 corresponding to the control signal CTRL11 when the first enable signal EN is activated. On the other hand, when the first enable signal EN is deactivated, the buffer BK11 may maintain the signal CTRL111, which is set regardless of the control signal CTRL11.

The decoder DEC11 may decode the signal CTRL111, and generate a selection code signal DO1. For example, when the duty cycle of the first correction target signal CCL11 has to be decreased, the decoder DEC11 may generate the selection code signal DO1 for allowing one of the first and second operation clock signals L11 and L12 to be selected as the first cycle signal CCL1. On the other hand, when the duty cycle of the first correction target signal CCL11 has to be increased, the decoder DEC11 may generate the selection code signal DO1 for allowing one of the third and fourth operation clock signals L13 and L14 to be selected as the first cycle signal CCL1. In addition, the decoder DEC11 may generate first to fourth power gating signals PG11 to PG14. For example, when the first operation clock signal L11 is selected among the first to fourth operation clock signals L11 to L14, the decoder DEC11 may deactivate the first power gating signal PG11, and activate the second to fourth power gating signals PG12 to PG14.

The second multiplexer MUX12 may output one of the first to fourth operation clock signals L11 to L14 as the first cycle signal CCL1 based on the selection code signal D01.

Figure 33:
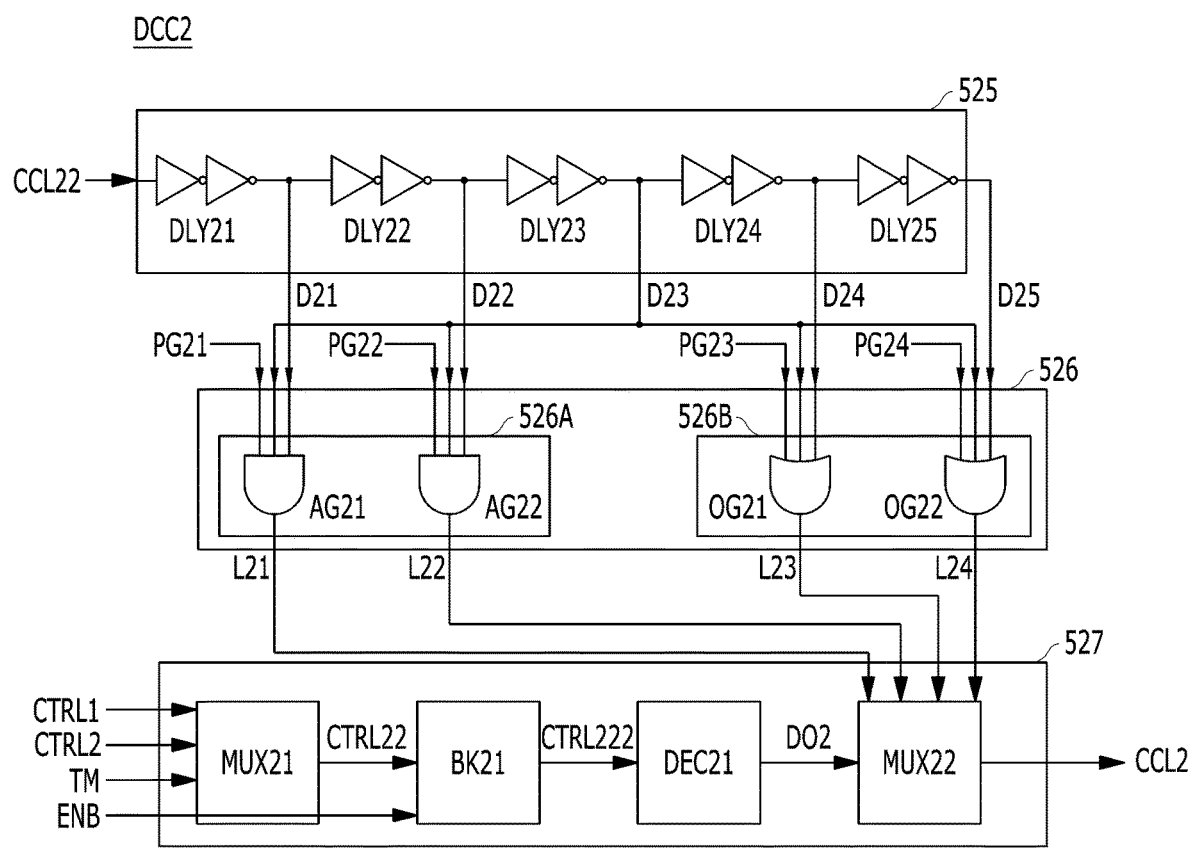
FIG. 33 is a block diagram illustrating a second duty cycle correction circuit illustrated in FIG. 31 in accordance with various embodiments of the present invention.

FIG. 33 is a block diagram illustrating the second duty cycle correction circuit DCC2 illustrated in FIG. 31. It is noted that the number of elements, element groups and signals included in the second duty cycle correction circuit DCC2 of FIG. 33 are described as an example for convenience in description, and that the present disclosure is not limited thereto.

Referring to FIG. 33, the second duty cycle correction circuit DCC2 may include a delay circuit 525, a logic circuit 526 and a selection circuit 527. Since the delay circuit 525 and the logic circuit 526 illustrated in FIG. 33 are the same as the delay circuit 125 and the logic circuit 126 illustrated in FIG. 9, respectively, detailed descriptions thereof are omitted.

The selection circuit 527 may include a first multiplexer MUX21, a buffer BK21, a decoder DEC21 and a second multiplexer MUX22.

The first multiplexer MUX21 may output one of the first and second control signals CTRL1 and CTRL2 as a control signal CTRL22 based on the test mode signal TM. For example, the first multiplexer MUX21 may output the first control signal CTRL1 as the control signal CTRL22 in the test mode, and output the second control signal CTRL2 as the control signal CTRL22 in the normal mode.

The buffer BK21 may generate a signal CTRL222 based on the control signal CTRL22 and the second enable signal ENB. For example, the buffer BK21 may generate the signal CTRL222 corresponding to the control signal CTRL22 when the second enable signal ENB is activated. On the other hand, when the second enable signal ENB is deactivated, the buffer BK21 may maintain the signal CTRL222, which is set regardless of the control signal CTRL22.

The decoder DEC21 may decode the signal CTRL222, and generate a selection code signal DO2. For example, when the duty cycle of the second correction target signal CCL22 has to be decreased, the decoder DEC21 may generate the selection code signal DO2 for allowing one of the first and second operation clock signals L21 and L22 to be selected as the second cycle signal CCL2. On the other hand, when the duty cycle of the second correction target signal CCL22 has to be increased, the decoder DEC21 may generate the selection code signal DO2 for allowing one of the third and fourth operation clock signals L23 and L24 to be selected as the second cycle signal CCL2. In addition, the decoder DEC21 may generate first to fourth power gating signals PG21 to PG24. For example, when the first operation clock signal L21 is selected among the first to fourth operation clock signals L21 to L24, the decoder DEC21 may deactivate the first power gating signal PG21, and activate the second to fourth power gating signals PG22 to PG24.

The second multiplexer MUX22 may output any one of the first to fourth operation clock signals L21 to L24 as the second cycle signal CCL2 based on the selection code signal DO2.

Figure 34:
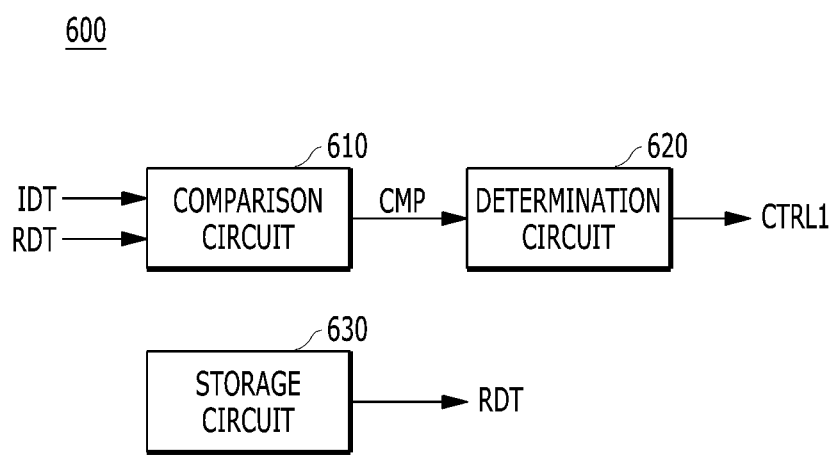
FIG. 34 is a block diagram illustrating a first controller illustrated in FIG. 25 in accordance with various embodiments of the present invention.

FIG. 34 is a block diagram illustrating the first controller 600 illustrated in FIG. 25.

Referring to FIG. 34, the first controller 600 may include a comparison circuit 610, a determination circuit 620 and a storage circuit 630.

The comparison circuit 610 may compare the image data IDT with reference data RDT, and generate a comparison signal CMP. For example, the comparison circuit 610 may compare some or all of digital values, each corresponding to the digital signal DOUT, included in the image data IDT, with digital values included in the reference data RDT.

The determination circuit 620 may determine the error of the depth information, and generate the first control signal CTRL1, based on the comparison signal CMP. For example, when the determination result indicates "fail", the determination circuit 620 may change the first control signal CTRL1, and when the determination result indicates "pass", the determination circuit 620 may maintain (i.e., fix) the first control signal CTRL1.

The storage circuit 630 may store the reference data RDT. Although it is described in the embodiment of the present disclosure that the storage circuit 630 may be configured in the first controller 600, the inventive concept is not limited to this, and the storage circuit 630 may be configured outside the first controller 600.

Figure 35:
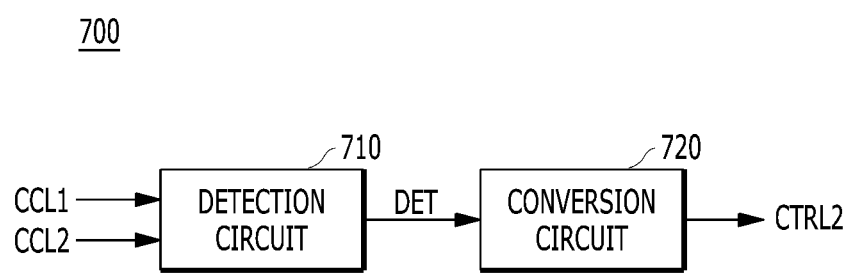
FIG. 35 is a block diagram illustrating a second controller illustrated in FIG. 25 in accordance with various embodiments of the present invention.

FIG. 35 is a block diagram illustrating the second controller 700 illustrated in FIG. 25.

Referring to FIG. 35, the second controller 700 may include a detection circuit 710 and a conversion circuit 720.

The detection circuit 710 may detect a duty cycle difference between the first cycle signal CCL1 and the second cycle signal CCL2. For example, the detection circuit 710 may detect the duty cycle difference by detecting a difference between a period where the first cycle signal CCL1 is at a logic high level (or a logic low level) and a period where the second cycle signal CCL2 is at the logic high level (or the logic low level), during a single cycle. The detection circuit 710 may generate a detection signal DET corresponding to the detection result.

The conversion circuit 720 may generate the second control signal CTRL2 corresponding to the detection signal DET. For example, the conversion circuit 720 may convert the detection signal DET into the second control signal CTRL2, which is a digital signal.

Hereinafter, an operation of the image sensing device having the above-described configuration in accordance with the present embodiment is described.

In the present embodiment, an operation of the image sensing device including the corrector 520 illustrated in FIG. 27 is representatively described.

In the test mode, the first controller 600 may statically generate the first control signal CTRL1 based on the image data IDT provided from the image sensor 500. For example, the first controller 600 may compare the image data IDT with the reference data RDT, and generate the first control signal CTRL1, corresponding to the comparison result, at least once.

In the test mode, the image sensor 500 may correct the depth information based on the first control signal CTRL1. For example, the image sensor 500 may correct the depth information by removing the duty cycle difference between the first cycle signal CCL1 and the second cycle signal CCL2. Particularly, the corrector 520 included in the image sensor 500 may remove the duty cycle difference between the first cycle signal CCL1 and the second cycle signal CCL2 based on the first control signal CTRL1 in the test mode.

Figure 36:
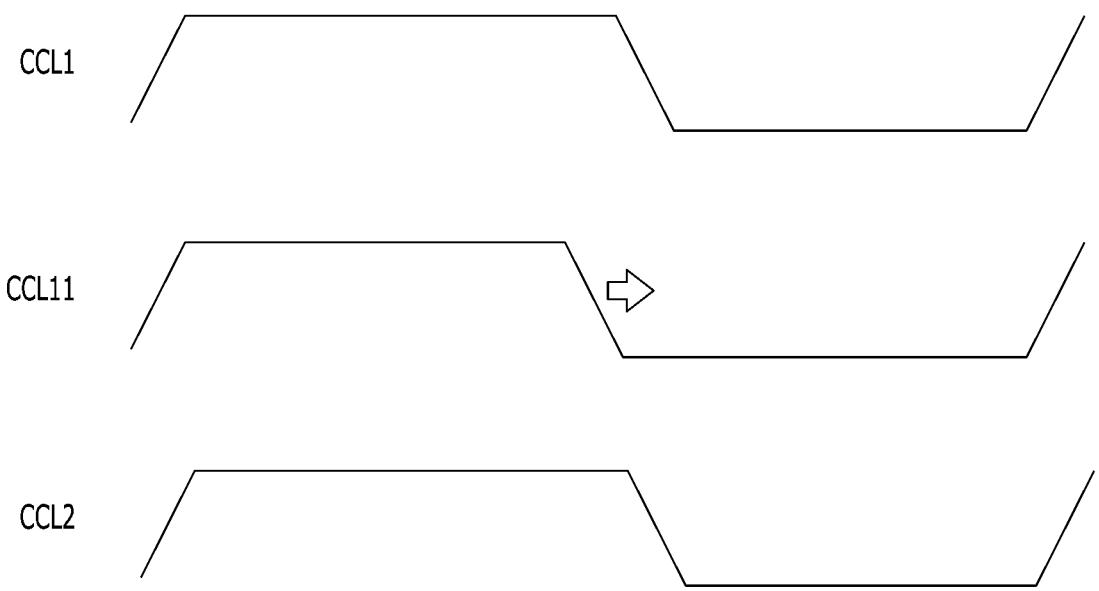
FIG. 36 is a timing diagram illustrating an example of an operation of the image sensing device in accordance with various embodiments of the present invention.

FIG. 36 is a timing diagram illustrating an example of an operation of the corrector 520 illustrated in FIG. 27.

Referring to FIG. 36, the corrector 520 may correct the duty cycle of the correction target signal CCL11, and generate the first cycle signal CCL1, based on the first control signal CTRL1. In other words, the corrector 520 may generate the first cycle signal CCL1 having a positive duty cycle by correcting the duty cycle of the correction target signal CCL11 according to the duty cycle of the second cycle signal CCL2.

Figure 37:
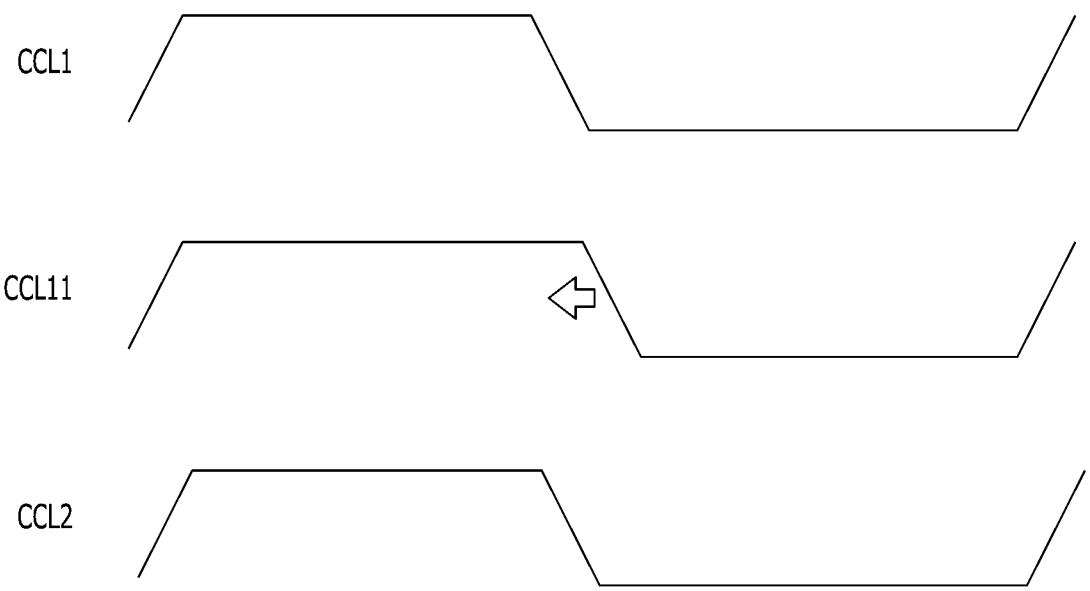
FIG. 37 is a timing diagram illustrating another example of an operation of the image sensing device in accordance with various embodiments of the present invention.

FIG. 37 is a timing diagram illustrating another example of the operation of the corrector 520 illustrated in FIG. 27.

Referring to FIG. 37, the corrector 520 may correct the duty cycle of the correction target signal CCL11, and generate the first cycle signal CCL1, based on the first control signal CTRL1. In other words, the corrector 520 may generate the first cycle signal CCL1 having a negative duty cycle by correcting the duty cycle of the correction target signal CCL11 according to the duty cycle of the second cycle signal CCL2.

In the normal mode, the second controller 700 may dynamically generate the second control signal CTRL2 based on the first and second cycle signals CCL1 and CCL2 provided in real time from the image sensor 500. For example, the second controller 700 may detect the duty cycle difference between the first cycle signal CCL1 and the second cycle signal CCL2, and generate the second control signal CTRL2, corresponding to the detection result, in real time.

In the normal mode, the image sensor 500 may correct the depth information based on the second control signal CTRL2. For example, the image sensor 500 may correct the depth information by removing the duty cycle difference between the first cycle signal CCL1 and the second cycle signal CCL2. Particularly, the corrector 520 included in the image sensor 500 may remove the duty cycle difference between the first cycle signal CCL1 and the second cycle signal CCL2 based on the second control signal CTRL2 in the normal mode. For example, the corrector 520 may generate the first cycle signal CCL1 having a positive duty cycle by correcting the duty cycle of the correction target signal CCL11 according to the duty cycle of the second cycle signal CCL2 (refer to FIG. 36). Alternatively, the corrector 520 may generate the first cycle signal CCL1 having a negative duty cycle by correcting the duty cycle of the correction target signal CCL11 according to the duty cycle of the second cycle signal CCL2 (refer to FIG. 37).

According to the present embodiment, the depth information may be corrected by easily removing the duty cycle difference between the first cycle signal and the second cycle signal in the test and normal modes.

In accordance with the embodiments of the present disclosure, operational reliability of the image sensing device may be improved because the depth information can be easily corrected.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

What is claimed is:

1. An image sensing device comprising:
an image sensor suitable for generating first and second cycle signals, correcting depth information by removing a duty cycle difference between the first and the second cycle signals, based on a control signal, and for generating image data according to the depth information; and
a controller suitable for detecting the duty cycle difference between the first and the second cycle signals based on the first and the second cycle signals, and for generating the control signal corresponding to a detection result.

2. The image sensing device of claim 1, wherein the first cycle signal is used to generate a light signal emitted to a subject, and
the second cycle signal is used to measure the depth information.

3. The image sensing device of claim 1, wherein the controller performs an error analysis operation on the depth information in real time, and dynamically generates the control signal, in a normal mode.

4. The image sensing device of claim 1, wherein the controller includes:
a detection circuit suitable for detecting a duty cycle difference between the first cycle signal and the second cycle signal, and generating a detection signal; and
a conversion circuit suitable for converting the detection signal into a digital signal, and outputting the control signal.

5. An image sensing device comprising:
a light driver suitable for emitting a light signal to a subject based on a first cycle signal;
a pixel driver suitable for generating a pixel driving signal based on a second cycle signal;
a pixel array including at least one pixel for sensing a light signal reflected from the subject, based on the pixel driving signal; and
a corrector suitable for generating the first and the second cycle signals from which a duty cycle difference between the first and the second cycle signals has been removed, based on a control signal and a clock signal.

6. The image sensing device of claim 5, wherein the corrector includes:
a first load suitable for generating a correction target signal corresponding to the clock signal;
a duty cycle correction circuit suitable for correcting a duty cycle of the correction target signal according to a duty cycle of the second cycle signal, and generating the first cycle signal, based on the control signal; and
a second load suitable for generating the second cycle signal corresponding to the clock signal.

7. The image sensing device of claim 6, wherein the duty cycle correction circuit includes:
a delay circuit suitable for sequentially delaying the correction target signal by a unit delay time, and generating a plurality of delayed clock signals;
a logic circuit suitable for performing a logic operation on the plurality of delayed clock signals, and generating a plurality of operation clock signals; and
a selection circuit suitable for outputting any one of the plurality of operation clock signals as the first cycle signal based on the control signal.

8. The image sensing device of claim 7, wherein the delay circuit includes a plurality of delay element groups coupled in series to one another, and suitable for outputting the plurality of delayed clock signals based on the correction target signal, and
wherein each of the delay element groups includes an even number of inverters coupled in series to one another.

9. The image sensing device of claim 7, wherein the logic circuit includes:
a first logic element group suitable for generating at least one operation clock signal having a negative duty cycle, compared to the clock signal, among the plurality of operation clock signals, based on a delayed clock signal having a medium delay amount, and delayed clock signals having delay amounts less than the medium delay amount among the plurality of delayed clock signals; and
a second logic element group suitable for generating at least one operation clock signal having a positive duty cycle, compared to the clock signal, among the plurality of operation clock signals, based on the delayed clock signal having the medium delay amount and delayed clock signals having delay amounts greater than the medium delay amount among the plurality of delayed clock signals.

10. The image sensing device of claim 7, wherein the selection circuit includes:
a decoder suitable for decoding the control signal, and for generating a selection code signal; and
a multiplexer suitable for outputting any one of the operation clock signals as the first cycle signal based on the selection code signal.

11. The image sensing device of claim 5, wherein the corrector includes:
a first load suitable for generating the first cycle signal corresponding to the clock signal;
a second load suitable for generating a correction target signal corresponding to the clock signal; and
a duty cycle correction circuit suitable for correcting a duty cycle of the correction target signal according to a duty cycle of the first cycle signal, and for generating the second cycle signal, based on the control signal.

12. The image sensing device of claim 11, wherein the duty cycle correction circuit includes:
a delay circuit suitable for sequentially delaying the correction target signal by a unit delay time, and for generating a plurality of delayed clock signals;

a logic circuit suitable for performing a logic operation on the plurality of delayed clock signals, and for generating a plurality of operation clock signals; and a selection circuit suitable for outputting any one of the plurality of operation clock signals as the second cycle signal based on the control signal.

13. The image sensing device of claim 12, wherein the delay circuit includes a plurality of delay element groups coupled in series to one another, and is suitable for outputting the plurality of delayed clock signals based on the correction target signal, and wherein each of the delay element groups includes an even number of inverters coupled in series to one another.

14. The image sensing device of claim 12, wherein the logic circuit includes:

a first logic element group suitable for generating at least one operation clock signal having a negative duty cycle, compared to the clock signal, among the plurality of operation clock signals, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, among the plurality of operation clock signals, based on the delayed clock signal having the medium delay amount and delayed clock signals having delay amounts greater than the medium delay amount among the plurality of delayed clock signals.

15. The image sensing device of claim 12, wherein the selection circuit includes:

a decoder suitable for decoding the control signal, and for generating a selection code signal; and a multiplexer suitable for outputting any one of the operation clock signals as the second cycle signal based on the selection code signal.

16. The image sensing device of claim 5, wherein the corrector includes:

a first load suitable for generating a first correction target signal corresponding to the clock signal;

a first duty cycle correction circuit suitable for correcting a duty cycle of the first correction target signal according to a duty cycle of the second cycle signal, and for generating the first cycle signal, based on the control signal and a first enable signal;

a second load suitable for generating a second correction target signal corresponding to the clock signal; and a second duty cycle correction circuit suitable for correcting a duty cycle of the second correction target signal according to a duty cycle of the first cycle signal, and for generating the second cycle signal, based on the control signal and a second enable signal.

17. The image sensing device of claim 16, wherein the first duty cycle correction circuit includes:

a delay circuit suitable for sequentially delaying the first correction target signal by a unit delay time, and for generating a plurality of delayed clock signals;

a logic circuit suitable for performing a logic operation on the plurality of delayed clock signals, and for generating a plurality of operation clock signals; and a selection circuit suitable for outputting any one of the plurality of operation clock signals as the first cycle signal based on the control signal and the first enable signal.

18. The image sensing device of claim 17, wherein the delay circuit includes a plurality of delay element groups coupled in series to one another, and suitable for outputting the plurality of delayed clock signals based on the first correction target signal, and wherein each of the delay element groups includes an even number of inverters coupled in series to one another.

19. The image sensing device of claim 17, wherein the logic circuit includes:

a first logic element group suitable for generating at least one operation clock signal having a negative duty cycle, compared to the clock signal, among the plurality of operation clock signals, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, among the plurality of operation clock signals, based on the delayed clock signal having the medium delay amount and delayed clock signals having delay amounts greater than the medium delay amount among the plurality of delayed clock signals.

20. The image sensing device of claim 17, wherein the selection circuit includes:

a buffer suitable for generating a signal corresponding to the control signal, or maintaining the signal which is set regardless of the control signal, based on the first enable signal;

a decoder suitable for decoding the signal, and generating a selection code signal; and a multiplexer suitable for outputting any one of the operation clock signals as the first cycle signal based on the selection code signal.

21. The image sensing device of claim 16, wherein the second duty cycle correction circuit includes:

a delay circuit suitable for sequentially delaying the second correction target signal by a unit delay time, and generating a plurality of delayed clock signals;

a logic circuit suitable for performing a logic operation on the plurality of delayed clock signals, and generating a plurality of operation clock signals; and a selection circuit suitable for outputting any one of the plurality of operation clock signals as the second cycle signal based on the control signal and the second enable signal.

22. The image sensing device of claim 21, wherein the delay circuit includes a plurality of delay element groups coupled in series to one another, and suitable for outputting the plurality of delayed clock signals based on the second correction target signal, and wherein each of the delay element groups includes an even number of inverters coupled in series to one another.

23. The image sensing device of claim 21, wherein the logic circuit includes:

a first logic element group suitable for generating at least one operation clock signal having a negative duty cycle, compared to the clock signal, among the plurality of operation clock signals, based on a delayed clock signal having a medium delay amount and delayed clock signals having delay amounts less than the medium delay amount among the plurality of delayed clock signals; and a second logic element group suitable for generating at least one operation clock signal having a positive duty cycle, compared to the clock signal, among the plurality of operation clock signals, based on the delayed clock signal having the medium delay amount and delayed clock signals having delay amounts greater than the medium delay amount among the plurality of delayed clock signals.

24. The image sensing device of claim 21, wherein the selection circuit includes:
   a buffer suitable for generating a signal corresponding to the control signal or maintaining the signal which is set regardless of the control signal, based on the second enable signal;
   a decoder suitable for decoding the signal, and generating a selection code signal; and
   a multiplexer suitable for outputting any one of the operation clock signals as the second cycle signal based on the selection code signal.

* * * * *